US011527283B2

(12) United States Patent
Chakraborty et al.

(10) Patent No.: US 11,527,283 B2
(45) Date of Patent: Dec. 13, 2022

(54) SINGLE ENDED BITLINE CURRENT SENSE AMPLIFIERS

(71) Applicant: International Business Machines Corporation, Armonk, NY (US)

(72) Inventors: Sudipto Chakraborty, Plano, TX (US); Rajiv Joshi, Yorktown Heights, NY (US); Alexander Fritsch, Esslingen (DE); Holger Wetter, Baden-Wuerttemberg (DE)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 17/149,915

(22) Filed: Jan. 15, 2021

(65) Prior Publication Data
US 2022/0230678 A1 Jul. 21, 2022

(51) Int. Cl.
*G11C 16/04* (2006.01)
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC .......................... G11C 11/419; G11C 11/418
See application file for complete search history.

(56) References Cited

U.S. PATENT DOCUMENTS

| 4,598,389 | A | 7/1986 | Duvvury et al. |
| 5,229,666 | A | 7/1993 | Sandhu |
| 5,521,875 | A | 5/1996 | Callahan |
| 5,804,992 | A | 9/1998 | Lee |
| 6,147,514 | A | 11/2000 | Shiratake |
| 6,160,733 | A | 12/2000 | Ebel |
| 7,102,335 | B1 | 9/2006 | Solie |
| 7,126,869 | B1 | 10/2006 | Chou |
| 7,268,520 | B2 | 9/2007 | Lu |
| 7,642,815 | B2 * | 1/2010 | Fort ........................ G11C 7/067 327/51 |
| 8,243,530 | B2 * | 8/2012 | Kang ...................... G11C 5/147 365/185.12 |
| 8,536,898 | B2 | 9/2013 | Rennie et al. |
| RE45,819 | E | 12/2015 | Kajigaya |
| 9,444,408 | B2 * | 9/2016 | Bedarida .................. G11C 7/12 |
| 9,589,604 | B1 | 3/2017 | Fritsch et al. |
| 2009/0040835 | A1 | 2/2009 | Ogawa |
| 2013/0148415 | A1 | 6/2013 | Shu et al. |

FOREIGN PATENT DOCUMENTS

WO PCT/EP2021/087395 4/2022

* cited by examiner

Primary Examiner — Pho M Luu
(74) Attorney, Agent, or Firm — Samuel Waldbaum; Ryan, Mason & Lewis, LLP

(57) ABSTRACT

A sense amplifier circuit includes a bitline node, a sense node, and a feedback circuit which is connected to the bitline node and to the sense node. The feedback circuit includes a cascode-connected pair of transistors configured to isolate the bitline node from an occurrence of a voltage variation on the sense node.

25 Claims, 10 Drawing Sheets

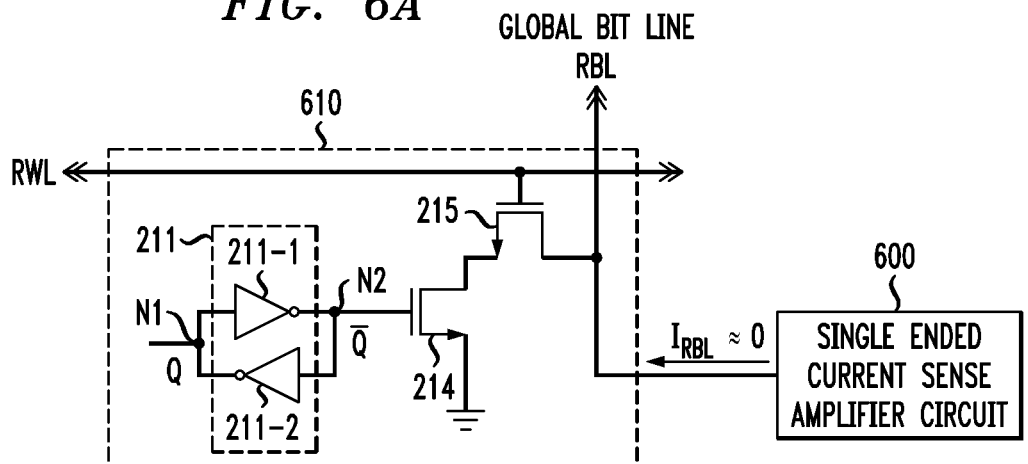
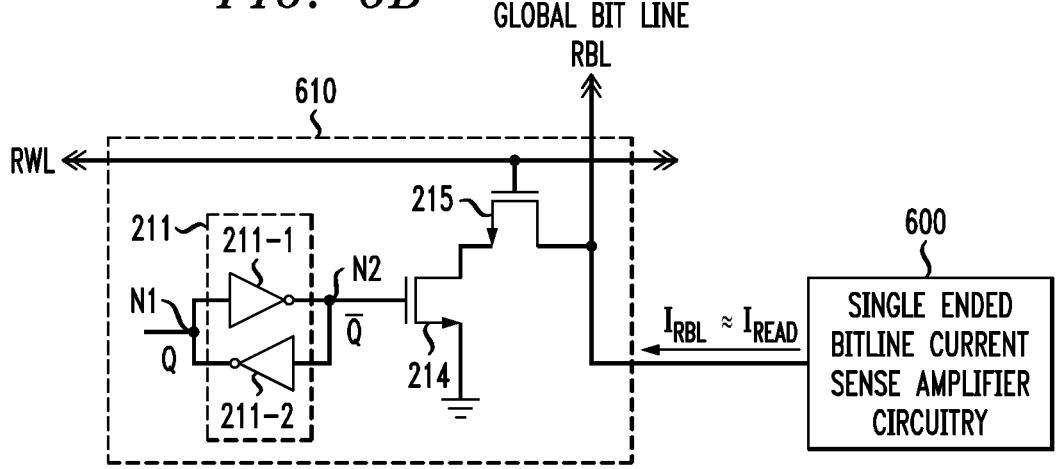

900

SINGLE ENDED BITLINE CURRENT SENSE AMPLIFIERS

BACKGROUND

This disclosure relates generally to current sense amplifier circuits, memory devices and systems which implement current sense amplifier circuits, and methods for configuring current sense amplifier circuits to read logic states of memory cells.

In a semiconductor memory device such as a dynamic random-access memory (DRAM) device or a static random-access memory (SRAM) device, data read operations are performed using sense amplifier circuits that are connected to bitlines of a memory array. The sense amplifier circuits are vital components in the peripheral circuitry of memory devices as the sense amplifier circuitry operates to sense or otherwise detect the stored data which is read from selected memory cells. The type and design of the sense amplifier circuitry which is implemented for a given memory device defines the robustness of bitline sensing, and strongly impacts performance metrics such as memory access time and overall power consumption/dissipation of the memory device. Recent trends have seen an increase in integration density of semiconductor memory devices and a reduction of operating voltages thereof. An increase in memory density results in an increase in bitline capacitance which results in reduced memory speed (e.g., reduced memory access times) and increased power consumption.

Conventional sense amplifier circuits include voltage mode sense amplifiers such as, e.g., single ended bitline voltage sense amplifier circuits and differential bitline voltage sense amplifier circuits which are designed to detect changes in voltage levels (i.e., voltage swings) on bitlines to determine logic states of memory cells. Voltage mode sense amplifier circuits typically operate by performing a bitline precharge operation to charge a single bitline (for singled ended voltage sense amplifiers) or complementary bitlines (for differential voltage sense amplifiers) to a target logic level (e.g., logic "1" voltage level) prior to asserting a row wordline that is connected to a target memory cell. When the row wordline is asserted to activate the access device(s) of the target memory cell and connect a storage element of the memory cell to the bitline(s), the target memory cell will start to pull the precharge voltage on the bits line(s) to either a low level or a high level, or precharged bitline voltage will remain essentially the same, depending on the logic state of the memory cell and the precharge voltage on the bitline(s). The need for bitline precharging and discharging to detect logic states of memory cells using voltage sense amplifiers can lead to significant power consumption and relatively slower memory access times as a result of parasitic bitline capacitance.

SUMMARY

Embodiments of the disclosure include singled ended current sense amplifier circuits, and memory devices and systems which implement single ended current sense amplifier circuits to perform memory read operations.

An exemplary embodiment includes a sense amplifier circuit which comprises a bitline node, a sense node, and a feedback circuit which is connected to the bitline node and to the sense node. The feedback circuit comprises a cascode-connected pair of transistors configured to isolate the bitline node from an occurrence of a voltage variation on the sense node. Advantageously, the implementation of the cascode-connected pair of transistors in the feedback circuit serves to isolate the bitline node from the sense node and prevent transient changes and ripples of a sense voltage on the sense node, which occur during operation of the sense amplifier circuit, from propagating to the bitline node and adversely affecting a precharge voltage level on a bitline connected to the bitline node.

Another exemplary embodiment includes a sense amplifier circuit which comprises a bitline node, a sense node, and a feedback circuit connected to the bitline node and to the sense node. The feedback circuit comprises a current sensing path between the bitline node and the sense node, and a first transistor serially connected in the current sensing path. The first transistor is configured to control a power down state of the sense amplifier circuit by selectively shutting down current flow in the current sensing path of feedback circuit. Advantageously, the implementation of the first transistor, which is serially connected in the current sensing path, enables cutting off the flow of quiescent operating current of the sense amplifier circuit during a standby mode when no read operations are being performed, to thereby provide decreased power consumption of the sense amplifier circuit during the standby mode.

Another exemplary embodiment includes a sense amplifier circuit which comprises an input stage and an output stage. The input stage comprises a bitline node connected to a bitline, a sense node connected to the output stage, and a feedback circuit connected to the bitline node and to the sense node. The feedback circuit comprises a first transistor, a second transistor, and a third transistor. The first and second transistors are serially connected between the bitline node and the sense node, wherein the first and second transistors comprise a current sensing path of the feedback circuit. The third transistor comprises a gate terminal connected to the sense node and a drain terminal connected to the bitline node. The first transistor is configured to control a power down state of the sense amplifier circuit by selectively shutting down current flow in the current sensing path of feedback circuit.

Another exemplary embodiment includes a memory device which comprises an array of memory cells, first control lines extending in a first direction across the array of memory cells and second control lines extending in a second direction across the array of memory cells, wherein the second control lines comprise a plurality of bitlines, and control circuitry coupled to the first control lines and to the second control lines. The control circuitry comprises singled ended bitline current sense amplifier circuitry coupled to the plurality of bitlines, wherein the singled ended bitline current sense amplifier circuitry comprises at least one sense amplifier circuit connected to a given bitline. The at least one sense amplifier circuit comprises a bitline node connected to the given bitline, a sense node, and a feedback circuit connected to the bitline node and to the sense node. The feedback circuit comprises a cascode-connected pair of transistors configured to isolate the bitline node from an occurrence of a voltage variation on the sense node.

Another exemplary embodiment includes a method, which comprises: generating a current which flows in a current sensing path of feedback circuit of a sense amplifier circuit, wherein the current sense path comprises first and second transistors which are cascode-connected between a bitline node and sense node of the sense amplifier circuit; generating, by the feedback circuit, a sense voltage on the sense node which is proportional to the current which flows in the current sense path; and applying a first control signal to a gate terminal of the first transistor of the feedback circuit to control a power down state of the sense amplifier circuit by deactivating the first transistor to shut down current flow in the current sensing path of feedback circuit.

Other embodiments will be described in the following detailed description of exemplary embodiments, which is to be read in conjunction with the accompanying figures.

BRIEF DESCRIPTION OF THE DRAWINGS

FIGS. 6A and 6B schematically illustrate methods for performing read operations using a single ended bitline current sense amplifier circuit, according to an exemplary embodiment of the disclosure.

DETAILED DESCRIPTION

Exemplary embodiments of the disclosure will now be described in further detail with regard to current mode sense amplifier circuits and memory devices and systems which implement current mode sense amplifier circuits. It is to be understood that the various features as shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration". Any embodiment or design described herein as "exemplary" is not to be construed as preferred or advantageous over other embodiments or designs.

Further, it is to be understood that the phrase "configured to" used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, the hardware may comprise discrete circuit elements (e.g., transistors, inverters, etc.), programmable elements (e.g., ASICs, FPGAs, etc.), processing devices (e.g., CPUs, GPUs, etc.), one or more integrated circuits, and/or combinations thereof. Thus, by way of example only, when a circuit is defined to be configured to provide a specific functionality, it is intended to cover, but not be limited to, embodiments where the circuit is comprised of elements, processing devices, and/or integrated circuits that enable it to perform the specific functionality when in an operational state (e.g., connected or otherwise deployed in a system, powered on, receiving an input, and/or producing an output), as well as to cover embodiments when the circuit is in a non-operational state (e.g., not connected nor otherwise deployed in a system, not powered on, not receiving an input, and/or not producing an output) or in a partial operational state.

Figure 1:
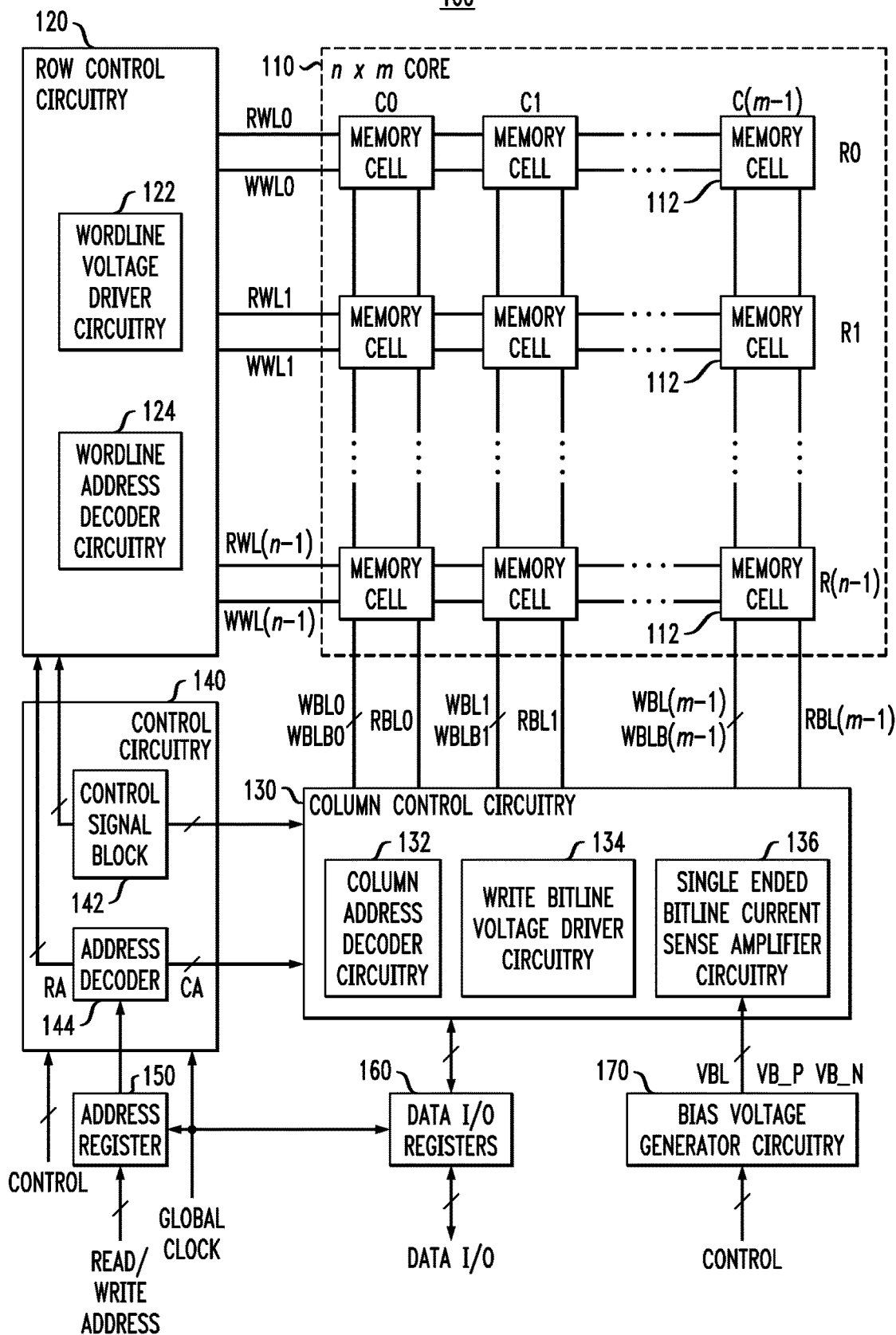
FIG. 1 schematically illustrates a memory device which implements single ended current sense amplifier circuitry, according to an exemplary embodiment of the disclosure.

FIG. 1 schematically illustrates a memory device which implements single ended current sense amplifier circuitry, according to an exemplary embodiment of the disclosure. More specifically, FIG. 1 schematically illustrates a memory device 100 which comprises a memory cell array 110, row control circuitry 120, column control circuitry 130, control logic circuitry 140, an address register 150, data input/output (I/O) registers 160, and bias voltage generator circuitry 170. The memory cell array 110 (alternatively, array core) comprises a plurality of memory cells 112 arranged in an n×m array of n rows (R0, R1, . . . , R(n−1)) and m columns (C0, C1, . . . , C(m−1)). In some embodiments, the memory device 100 comprises a volatile RAM device wherein the memory cells 112 of the memory cell array 110 comprises SRAM memory cells. In some embodiments, the memory cells 112 are implemented using an 8-transistor (8T) SRAM architecture, as discussed in further detail below in conjunction with FIG. 2.

For SRAM memory, data is typically stored as "words" where each word has a specified number of bits, e.g., 8, 16, 32, 64, etc., where data is read from and written to the memory cell array 110 in word units. For example, in an exemplary embodiment where the number of rows n is 128, and the number of columns m is 128, assuming that the word size 32, each row of memory cells 112 can store 4 words. In this example, the number of words that can be stored in the memory cell array 110 of size 128×128 is 128 rows×4 words/row=512 words.

The memory cell array 110 comprises a plurality (n) of read wordlines RWL0, RWL1, . . . , RWL(n−1) (generally denoted RWL), and a plurality (n) of write wordlines WWL0, WWL1, . . . , WWL(n−1) (generally denoted WWL). The read wordlines RWLs and write wordlines WWLs extend in first direction (e.g., row direction) across the memory cell array 110. Each row of memory cells 112 in the memory cell array 110 comprises a respective RWL/WWL pair, which RWL/WWL pair is connected to each memory cell in the given row.

Furthermore, the memory cell array 110 comprises a plurality (m) of write bitline pairs WBL0/WBLB0, WBL1/WBLB1, . . . , WBL(m−1)/WBLB(m−1) (generally denoted WBL/WBLB), and a plurality (m) of global read bitlines RBL0, RBL1, . . . , RBL(m−1) (generally denoted RBL). The write bitline pairs WBL/WBLB comprise complementary write bitlines. The write bitline pairs WBLs/WBLBs and the read bitlines RBLs extend in a second direction (e.g., column direction) across the memory cell array 110. Each column of memory cells 112 in the memory cell array 110 comprises a respective write bitline pair WBL/WBLB, and a respective read bitline RBL. It is to be understood that the various control lines RWLs, WWLs, WBLs, WBLBs, and RBLs depicted in FIG. 1 are implemented in exemplary embodiments where the memory cells 112 comprise 8T SRAM cells. The type of control lines and/or number of control lines can vary depending on the architecture of the memory cells 112.

As further shown in FIG. 1, the row control circuitry 120 comprises wordline voltage driver circuitry 122, and wordline address decoder circuitry 124. The column control circuitry 130 comprises column address decoder circuitry 132, write bitline voltage driver circuitry 134, and single ended bitline current sense amplifier circuitry 136. The control logic circuitry 140 comprises a control signal block 142, and an address decoder 144. The control signal block 142 comprises circuitry that is configured to generate control signals to control the row control circuitry 120 and the column control circuitry 130. For example, in some embodiments, the control signal block 142 receives a global clock signal and other control signals from a control system (e.g., processor, operating system, etc.) and utilizes the global clock signal and/or control signals to generate, e.g., clock signals, read enable signals, write enable signals, etc., to control memory access operations (data read operations and data write operations) that are performed by the peripheral row and column control circuitry 120 and 130.

The memory device 100 receives a read/write address from, e.g., a processor, host operating system, etc., and stores the read/write address in the address register 150. The address register 150 is controlled by the global clock signal to latch in a read/write address, and output the read/write address to the address decoder 144. The address decoder 144 decodes the read/write address to generate a row address (denoted RA) and a column address (denoted CA). The row address RA is provided to the row control circuitry 120 and the column address CA is provided to the column control circuitry 130, which are further processed by the row control circuitry 120 and the column control circuitry 130 to select target memory cells 112 to perform data access operations (e.g., read and write operations).

In particular, the row control circuitry 120 is configured to control activation/deactivation of read wordlines RWL and write wordlines WWL to perform read and write operations. More specifically, in some embodiments, the wordline address decoder circuitry 124 is configured to decode a row address RA that is received from the address decoder 144 and determine which row wordline RWL to activate for a read operation, or which write wordline WWL to activate for a write operation, based on the decoded row address RA. The wordline voltage driver circuitry 122 is configured to generate RWL and WWL control signals to drive the selected read wordlines and the write wordlines WWLs to perform read and write operations, and otherwise generate other voltages that are applied to row and write wordlines which are not selected during a given data access operation, etc. The row control circuitry 120 receives various control signals from the control signal block 142 including, but not limited to, clock signals, write enable signals, read enable signals, address decode enable signals, etc., to control the operation of the wordline voltage driver circuitry 122 and the operation of the wordline address decoder circuitry 124.

The column control circuitry 130 is configured to control the reading and writing of one or more data words to target memory cells 112 within a given row of memory cells connected to a RWL or WWL that is activated by row control circuitry 120. In particular, the column address decoder circuitry 132 is configured to decode the column address CA that is received from the address decoder 144, and determine which columns in the memory cell array 110 to select for the given read or write operation. For a write operation, the write bitline voltage driver circuitry 134 is configured to drive the complementary write bitlines WBL/WBLB for each column that is selected for the given write operation to store a data word.

Figure 3:
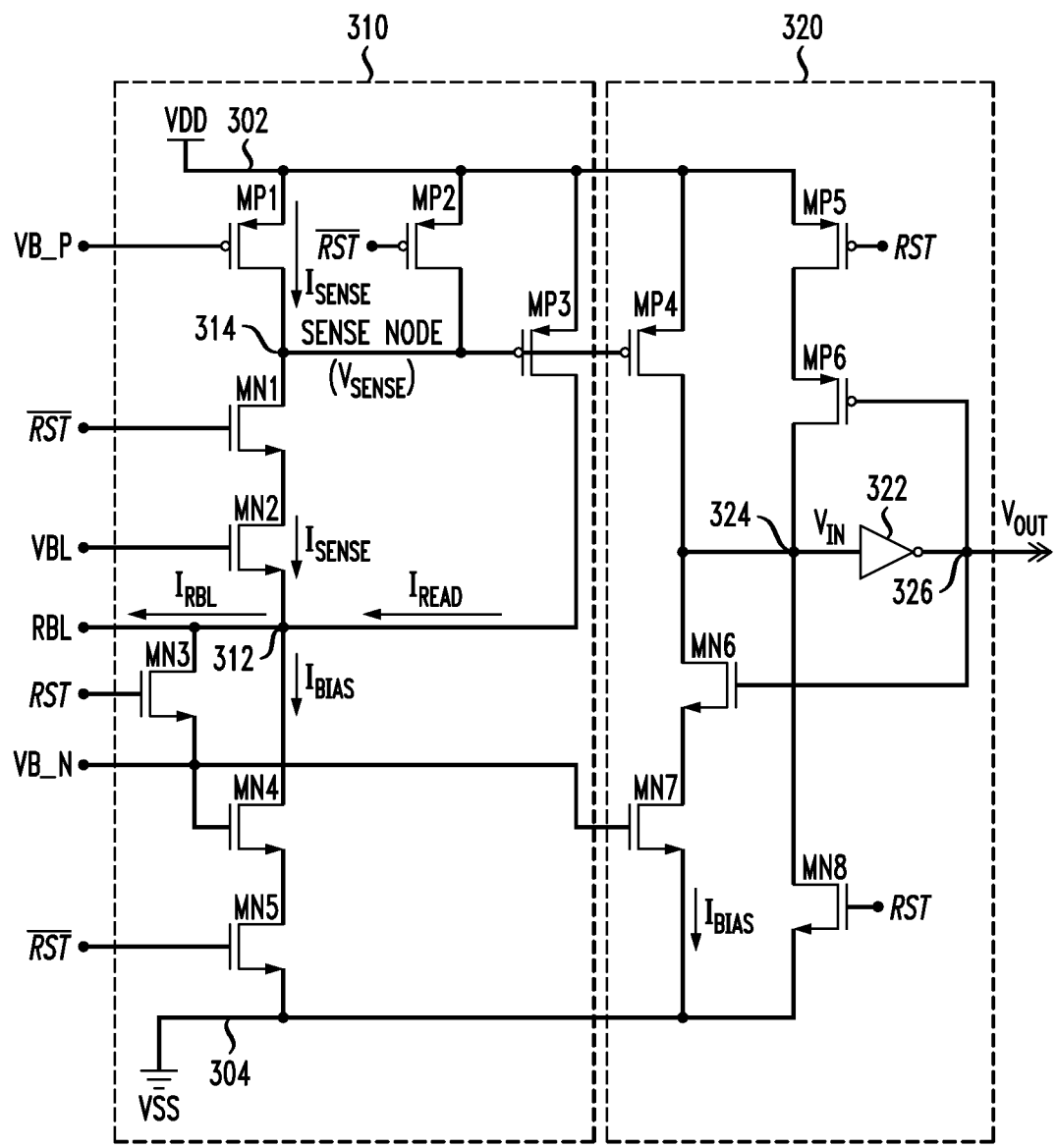
FIG. 3 schematically illustrates a single ended bitline current sense amplifier circuit, according to an exemplary embodiment of the disclosure.
Figure 4:
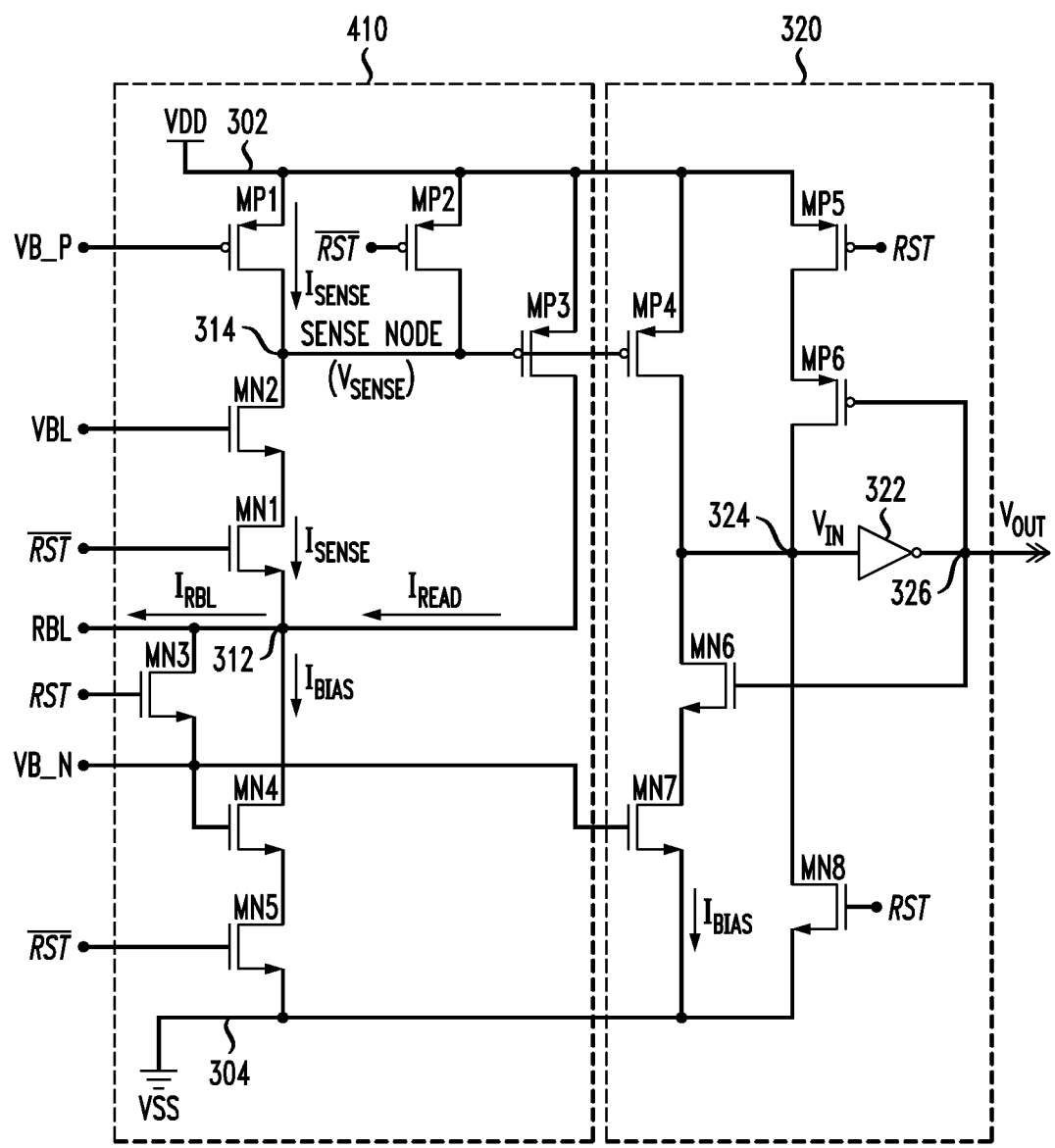
FIG. 4 schematically illustrates a single ended bitline current sense amplifier circuit, according to another exemplary embodiment of the disclosure.

The single ended bitline current sense amplifier circuitry 136 is connected to the global read bitlines RBLs of the memory cell array 110. The single ended bitline current sense amplifier circuitry is activated to perform a read operation. In particular, the single ended bitline current sense amplifier circuitry 136 is configured to sense or detect the logic state (e.g., logic "0" or logic "1") of a given memory cell 112 within an activated row by sensing a magnitude of current that is generated on the global read bitline RBL connected to the given memory cell 112. In some embodiments, the single ended bitline current sense amplifier circuitry 136 comprises m individual current sense amplifier circuit blocks, wherein each individual current sense amplifier circuit block is connected to a respective one of the read bitlines RBL0, RBL1, . . . , RBL(m−1). Exemplary embodiments of single ended bitline current sense amplifier circuits which can be implemented in the memory device 100 are depicted in FIGS. 3 and 4, the details of which will be discussed in further detail below.

In some embodiments, the column address decoder circuitry 132 comprises column select circuitry and/or column multiplexer/demultiplexer circuitry (e.g., bitline multiplexers or column multiplexers) to selectively connect the selected column lines to an I/O port that is coupled to the data I/O registers 160. In some embodiments, the multiplexer/demultiplexer circuitry is disposed behind the current sense amplifier circuitry 136 such that each column (i.e., each RBL) is connected to an individual current sense amplifier circuit block. For example, for a write operation, a 32-bit word can be stored into a data input register of the I/O registers 160, wherein demultiplexing circuitry selectively connects each bit of the 32-bit word in the I/O register 160 to the write bitline voltage driver circuits connected to respective ones of the 32 columns (e.g., 32 WBL/WBLB pairs) that are selected (via the decoded column address CA) to store the 32-bit word in the memory cells 112 (of the activated row of memory cells 112) which are connected to the selected columns.

Moreover, for a read operation, each bit of a 32-bit word can be read by the 32 individual current sense amplifier circuit blocks connected to the 32 read bitline RBL of the selected columns, wherein the outputs of the 32 current sense amplifier circuit blocks can be selectively connected to the I/O port by operation of the multiplexer circuitry which connects the output ports of the current sense amplifier circuit blocks to the I/O port. The column control circuitry 130 receives various control signals from the control signal block 142 including, but not limited to, clock signals, write enable signals, read enable signals, address decode enable signals, etc., to control the operation of the column address decoder circuitry 132, the write bitline voltage driver circuitry 134, and the single ended bitline current sense amplifier circuitry 136.

In other embodiments, all bitlines RBL0, RBL1, ..., RBL(m−1) are activated during a read operation such that an m-bit word is read from a selected row of the memory array 110 during the read operation (and similarly, m-bit words are written to a given row of the memory array 110 during a write operation). In this instance, multiplexer/demultiplexer circuitry may be implemented as part of the column address decoder circuitry 132.

The bias voltage generator circuitry 170 is configured to generate a plurality of different direct current (DC) bias voltages that are applied to the single ended bitline current sense amplifier circuitry 136 to bias the current sense amplifier circuitry 136 to desired operating points and to adjust the sensitivity of the current sense amplifier circuitry 136 for optimal operation. For example, in some embodiments, the bias voltage generator circuitry 170 generates various DC bias voltages, e.g., VB_P, VB_N, and VBL, which are applied to bias voltage input nodes of each current sense amplifier circuit block of the single ended bitline current sense amplifier circuitry 136 (exemplary details of which will be explained in further detail below in conjunction with FIGS. 3 and 4). The bias voltage generator circuitry 170 is dynamically configurable by digital control signals which serve to adjust the voltage levels of the DC bias voltages that are generated by the bias voltage generator circuitry 170, to adjust the operating points and sensitivity of the current sense amplifier circuitry. In some embodiments, the bias voltage generator circuitry 170 is part of the control logic circuitry 140 and is controlled by the control signal block 142.

It is to be understood that while only one memory cell array 110 is shown in FIG. 1, the memory device 100 can include one or more additional memory array cores each with associated row and column control circuitry. In addition, the memory cell array 110 can be logically divided into a plurality of banks wherein the address decoder 144 is configured to generate a bank address in addition to row and column addresses. The use of multiple array cores and banking allows for parallel data access operations to be performed in the separate arrays and or banks for accessing different words.

It is to be understood that while the circuit blocks 120, 130, 140, and 170 are generically depicted in FIG. 1, it is to be understood that the circuit blocks 120, 130, 140, and 170 can be implemented using various circuit configurations and techniques for managing and controlling SRAM memory, which are suitable for the given application. For example, the circuit blocks 120, 130, 140, and 170 can vary depending on, e.g., the type of SRAM memory cells that are used in the memory array 110 (e.g., 6T SRAM cells, 8T SRAM cells, multi-port SRAM cells, etc.). In addition, as noted above, the types of control lines and/or number of control lines will vary depending on the architecture of the memory cells 112. In some embodiments, the memory cells 110 (e.g., SRAM memory cells) and the circuit blocks 120, 130, 140, and 170, together with other circuitry for controlling the memory array 110, can be implemented as application specific integrated circuits (ASICs), field programmable gate arrays (FPGAs), etc., using complementary metal-oxide-semiconductor (CMOS) technologies in which the transistors that form the logic gates, switches, memory cells, etc., comprise PMOS (p-type MOS) transistors and NMOS (n-type MOS) transistors. In some embodiments, the PMOS and NMOS transistors are implemented using Fin-type field-effect transistor (FinFET) technologies (e.g., 7 nm MOSFET technology node).

The memory device 100 shown in FIG. 1 can be implemented in various configurations and applications. For example, in some embodiments, the memory device 100 comprises an integrated circuit (IC) memory device which is implemented as volatile RAM memory for a computing system or device (e.g., server machine, computer, mobile device, routers, printers, LCD screens, etc.). For example, in some embodiments, the memory device 100 can be implemented as a cache memory (e.g., L1, L2, or L3 cache) for a processor (e.g., central processing unit (CPU), microprocessor, microcontroller, etc.). In some embodiments, the memory device 100 is integrated as RAM or cache memory in a CPU, microprocessor, microcontroller, etc. In other embodiments, the memory device 100 is a standalone memory IC chip that is disposed between the processors and main memory for use as, e.g., cache memory. In other embodiments, the memory device 100 can be utilized in other application to implement, e.g., CPU register files, internal CPU caches and external burst mode caches, hard disk buffers, router buffers, etc.

It is to be understood that the various circuit blocks 120, 130, 140, and 170 and associated functionalities collectively comprise a control system which is operatively coupled to the memory cell array 110, and configured to perform various data access operations. Moreover, the control system comprises additional components (e.g., circuitry, processors, etc.) to implement memory management functions and perform data access operations, wherein such additional components include, but are limited to, an integrated memory controller, memory/storage interface circuitry, etc.

Figure 2:
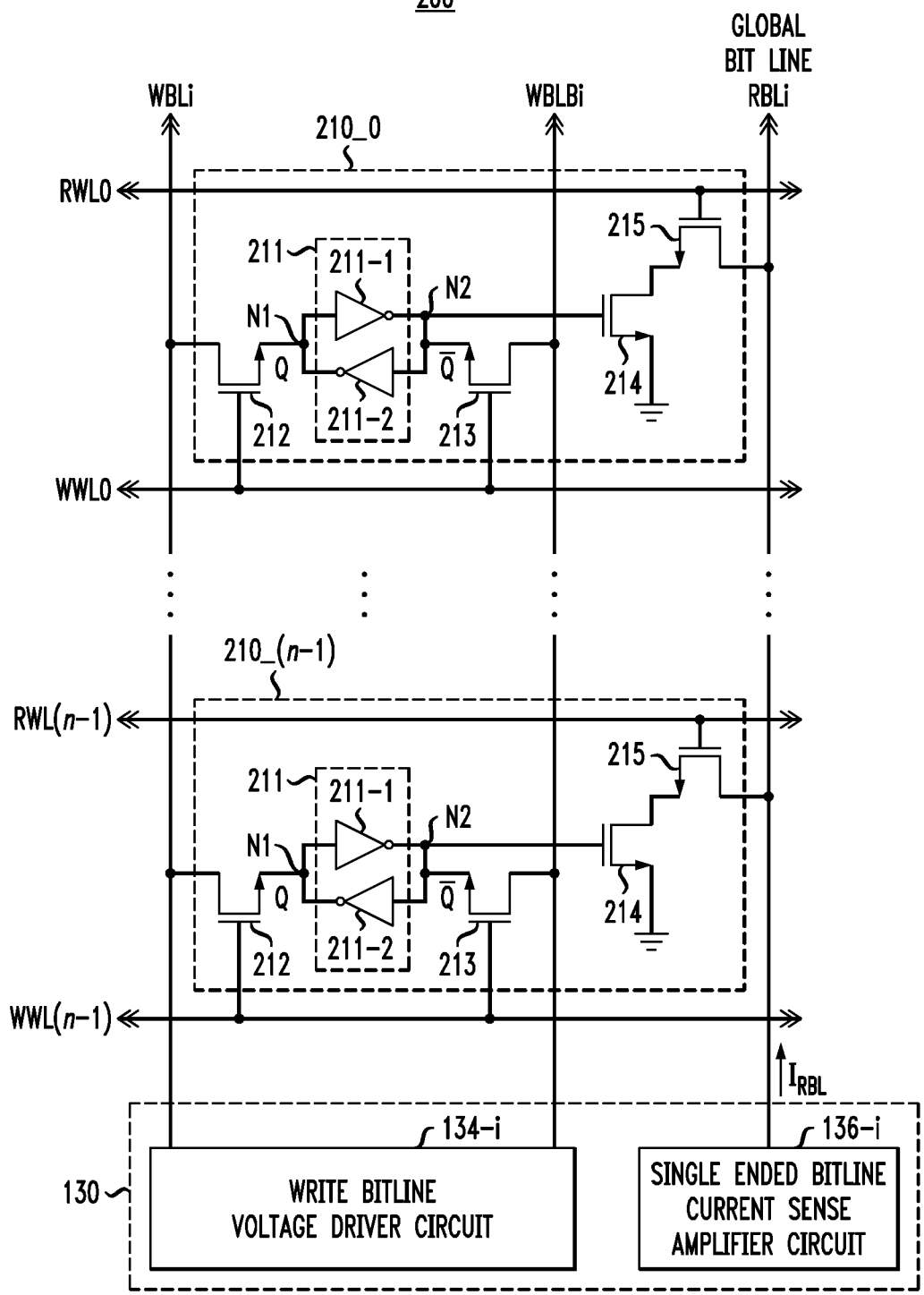
FIG. 2 schematically illustrates a column architecture of a memory device which implements single ended current sense amplifier circuitry, according to an exemplary embodiment of the disclosure.

FIG. 2 schematically illustrates a column architecture of a memory device which implements single ended current sense amplifier circuitry, according to an exemplary embodiment of the disclosure. In some embodiments, FIG. 2 schematically illustrates a column architecture 200 of the memory device 100 of FIG. 1 in an exemplary embodiment where the memory cells 112 are implemented using an 8T SRAM memory architecture, and wherein FIG. 2 represents a single column (e.g., $i^{th}$ column Ci) of the memory device 100, according to an exemplary embodiment of the disclosure. As shown in FIG. 2, the column architecture 200 comprises a plurality (n) of 8T SRAM memory cells 210_0, ..., 210_(n−1) (generally denoted 210). Each SRAM memory cell 210 comprises a storage element 211, first and second write access transistors 212 and 213, and first and second read access transistors 214 and 215, wherein the transistors 212, 213, 214, and 215 are NMOS transistors. The storage element 211 comprises a pair of cross-coupled inverters 211-1 and 211-2, a first storage node N1 which stores a logic value Q, and a second storage node N2 which stores a complementary logic value $\overline{Q}$. In some embodiments, the logic value of $\overline{Q}$ (e.g., Q=1 or Q=0) represents the logic state of the memory cell 210, while the logic value of Q represents the complementary logic value of the memory cell 210. The SRAM memory cells 210 preserve their logic states as long as power is applied to the SRAM memory cells 210.

As further shown in FIG. 2, gate terminals of the first and second write access transistors 212 and 213 are coupled to the write wordline WWL for the given row. In addition, the first write access transistor 212 has a drain terminal coupled to the write bitline WBLi for the $i^{th}$ column, and a source terminal coupled to the first storage node N1 of the storage element 211. The second write access transistor 213 has a drain terminal coupled to the complementary write bitline WBLBi for the i$^{th}$ column, and a source terminal coupled to the second storage node N2 of the storage element 211. Further, the second read access transistor 215 has a gate terminal coupled to the read wordline RWL for the given row, a drain terminal coupled to the global read bitline RBLi for the i$^{th}$ column, and a source terminal coupled to a drain terminal of the first read access transistor 214. In addition, the first read access transistor 214 has a gate terminal coupled to the second storage node N2 of the storage element 211, and a source terminal connected to a ground rail (e.g., VSS=0).

The global read bitline RBLi for the i$^{th}$ column is connected to a singled ended current sense amplifier circuit block 136-i. As noted above, in some embodiments, the singled ended bitline current sense amplifier circuitry 136 (FIG. 1) comprises an individual current sense amplifier circuit block for each column (C0, C1, . . . , C(m–1)), wherein each individual current sense amplifier circuit block is connected to a respective read bitline RBL for the respective column. In addition, as shown in FIG. 2, the read bitline RBLi for the given i$^{th}$ column is coupled to the drain terminals of the second read access transistors 215 of all SRAM memory cells 210_0, . . . , 210_(n–1) in the given i$^{th}$ column. As further shown in FIG. 2, the write bitline WBLi for the i$^{th}$ column is coupled to the drain terminals of the first write access transistors 212 of all SRAM memory cells 210 in the i$^{th}$ column, and the complementary write bitline WBLBi for the i$^{th}$ column is coupled to the drain terminals of the second write access transistors 213 of all SRAM memory cells in the it column. The complementary write bitline pair WBLi/WBLBi is coupled to a write bitline voltage driver circuit block 134-i for the i$^{th}$ column.

For illustration purposes, exemplary write and read operations will be discussed with regard to the SRAM memory cell 210_0 in row R0. Writing to the SRAM memory cell 210_0 is achieved by applying a logic "1" voltage level (e.g., VDD) onto one of the complementary write bitlines WBLi or WBLBi, while applying a logic "0" voltage level (e.g., VSS) on the other, and then driving the write wordline WWL0 to logic "1" to activate the first and second write access transistors 212 and 213 and allow the voltage levels held on the complementary write bitlines WBLi and WBLBi to overcome the current state of the storage element 211. For example, to write a logic "0" to the SRAM cell 210_0, a logic "0" voltage is applied to the write bitline WBLi, and a logic "1" voltage is applied to the complementary write bitline WBLBi. The write wordline WWL0 is then asserted, which causes the logic "0" value of the write bitline WBLi to be stored at the first storage node N1, and the complementary logic "1" value to be stored at the second storage node N2. Similarly, to write a logic "1" to the SRAM cell 210_0, a logic "1" voltage is applied to the write bitline WBLi, and a logic "0" voltage is applied to the complementary write bitline WBLBi. The write wordline WWL0 is then asserted, which causes the logic "1" value of the write bitline WBLi to be stored at the first storage node N1, and the complementary logic "0" value to be stored at the second storage node N2.

A read operation for reading the logic state of the SRAM memory cell 210_0 is performed by asserting the read wordline RWL0 to a logic "1" level, and sensing a magnitude of the read bitline current $I_{RBL}$ that flows on the read bitline RBLi. For example, when the read wordline RWL0 is asserted to VDD, the second read access transistor 215 is driven to an ON state. When the value $\overline{Q}$=0 at the second storage node N2 (meaning that the memory cell 210_0 has a logic state of logic Q=1), the first read transistor 214 will be in an OFF state. As such, no current path is generated from the read bitline RBLi to ground (VSS) through the first and second read transistors 214 and 215 and, therefore, no read bitline current $I_{RBL}$ flows from the single ended bitline current sense amplifier circuit block 136-i to the read bitline RBLi, i.e., IRBL=0 (except for a small amount of leakage current that flows on the read bitline RBLi due to leakage of the SRAM memory cells 210 coupled to the read bitline RBLi).

On the other hand, when the value $\overline{Q}$=1 at the second storage node N2 (meaning that the memory cell 210_0 has a logic state of logic Q=0), the first read transistor 214 will be in an ON state. As such, the activation of the first and second read transistors 214 and 215 creates a path from the read bitline RBLi to ground (VSS) through the first and second read transistors 214 and 215, which causes read bitline current $I_{RBL}$ to flow from the single ended bitline current sense amplifier circuit 136-i to the read bitline RBL, wherein the read bitline current $I_{RBL}$ will have a sufficient magnitude which is greater than the leakage current.

The single ended bitline current sense amplifier circuit 136-i is configured to sense the magnitude of the read bitline current IRL that flows on the read bitline RBLi to determine the logic state of the memory cell 210 (exemplary embodiments of the single ended bitline current sense amplifier circuit 136-i will be discussed in further detail below in conjunction with FIGS. 3 and 4). The magnitude of the read bitline current $I_{RBL}$ is sensed by an input stage (or current sensing stage) of the single ended bitline current sense amplifier circuit block 136-i. The input stage of the single ended bitline current sense amplifier circuit block 136-i converts the sensed read bitline current IRL to an analog voltage, which is then amplified and converted to a digital logic level by a preamplifier and rail-to-rail latch circuit in an output stage of the single ended bitline current sense amplifier circuit block 136-i. The digital logic level which is output from the single ended bitline current sense amplifier circuit block 136-i represents the read logic state of the SRAM memory cell 210_0.

As explained in further detail below, single ended bitline current sense amplifier circuits according to exemplary embodiments of the disclosure as discussed herein provide many advantages over voltage mode sense amplifiers such as, e.g., single ended bitline voltage sense amplifier circuits and differential bitline voltage sense amplifier circuits. For example, the exemplary single ended bitline current sense amplifier circuits operate by sensing current levels on bitlines to detect the logic states of memory cells, as opposed to voltage sense amplifiers which detect changes in voltage levels (i.e., voltage swings) on bitlines to determine logic states of memory cells. As compared to voltage sense amplifiers, the exemplary current sense amplifiers discussed herein provide higher operating bandwidths (BW) (e.g., lower memory access times), lower power consumption, lower sensitivity to bitline parasitic capacitances, lower memory array area overhead, and other advantages as will be discussed below.

As noted above, voltage sense amplifier circuits typically operate by performing a bitline precharge operation to charge a single bitline (for singled ended voltage sense amplifiers) or complementary bitlines (for differential voltage sense amplifiers) to a target logic level (e.g., logic "1" voltage level) prior to asserting a row wordline that is connected to a target memory cell. For example, when performing a read operation using a voltage sense amplifier, the access time for the memory cell will primarily depend on the time that is required to develop a sufficient voltage difference on the bitline(s) which can be properly sensed by the voltage sense amplifier for a reliable measurement of the logic state of the memory cell by the voltage sense amplifier. However, since access transistors of the memory cell are relatively small, and the bitlines have a relatively high capacitance, the bitline voltage will slowly fall, which reduces the memory access speed. In particular, for a read operation, the time that is needed for a sufficient voltage difference ($\Delta V$) to be developed on a given bitline is a function of the bitline capacitance, the required voltage difference ($\Delta V$), and the read current that the memory cell draws from the bitline. In this regard, small read currents, large capacitances and/or large voltage differences result in slow access times.

Furthermore, the charging currents that are needed for precharging the bitlines to perform read operations can lead to a significantly large amount of average power dissipation of the memory system with increases in the parasitic capacitances of the bitlines and/or the amount of voltage differential ($\Delta V$) which are needed for reliable detection and operation of the voltage sense amplifiers. Moreover, the coincident precharging of several bitlines can lead to large peak currents which, in turn, can lead to increased fatigue and wearing of the read bitlines over the lifetime of the memory device. Moreover, large peak currents may require a high degree of decoupling to maintain the stability of the power supply rails, in particular to maintain the voltage of the supply rails.

As the number of memory cells connected to a given bitline increases, the parasitic capacitance of the given bitline increases as a result of, e.g., a total loading capacitance of the access transistors of the memory cells that are coupled to the given bitline. To minimize the adverse effects of the parasitic bitline capacitances on memory access times and power dissipation, and to implement larger memory arrays, a hierarchical bitline scheme is commonly used to divide the memory cells in a given column of the memory array into groups of memory cells. Each group of memory cells in the given column is connected to a respective "local bitline" and each "local bitline" is connected to a global bitline for the given column using a respective switching device which connects the local bitline to the global bitline. For example, assume a given column of a memory array comprises 128 memory cells. The memory cells in the given column can be divided into four (4) groups, where each group comprises 32 memory cells of the 128 memory cells in the given column. Each group of 32 memory cells are connected to a respective one of four (4) local bitlines, and the four local bitlines are connected to a single global bitline of the given column.

During a memory access operation for the given column, only one local bitline (which is connected to a target group of memory cells) of the given column is connected to the global bitline of the given column via activation of the corresponding switch device. In this manner, each local bitline for a given column provides a fraction of the capacitive load of all the memory cells in the given column, so each memory access operation provides a smaller capacitive load as compared to the larger capacitive load that would result if all the memory cells in a given column of the memory array were connected to a single (global) bitline. A hierarchical bitline scheme supports a relatively large memory size without sacrificing performance, wherein the memory array is partitioned into segments, and several segments are stitched to form the full array. However, each segment requires local evaluation circuitry to connect local bitlines to their respective global bitlines, and this local circuitry, along with a required layout fencing of each segment, results in increased area and a larger footprint of the memory array, as well as added complexity resulting from the circuitry (e.g., switches that are needed to control the local and global bitlines.

The above-noted disadvantages and performance issues associated with voltage sense amplifiers are overcome by implementing single ended bitline current sense amplifier circuits according to exemplary embodiments as discussed herein. For example, as noted above, a single ended bitline current sense amplifier circuit operates by sensing a bitline current that is generated on a given bitline (e.g., read bitline RBLi, FIG. 2) by activation of a selected memory cell connected to the given bitline. In some embodiments, the single ended bitline current sense amplifier circuit is configured to have a relatively low input impedance at an input node of the current sense amplifier circuit which is connected to the end of the bitline, and to maintain a relatively constant bias voltage on the bitline (e.g., read bitline RBLi) during the read operation to thereby prevent a large voltage swing on the given bitline during the read operation.

By preventing or minimizing a voltage swing on the bitline connected to the input of the current sense amplifier circuit, the parasitic capacitance of the bitline does not lead to any substantial increase in power consumption (as compared to voltage sense amplifiers) and, consequently, the bitline capacitance does not lead to an unwanted increase in current flow on the bitline during a read operation due to a change in the bitline voltage. In this regard, maintaining a virtually constant voltage on the bitline during the read operation (no voltage swing), coupled with a low input impedance of the input of the current sense amplifier, allows for a relatively small read current to be generated on the bitline which is sufficient for the current bitline sense amplifier to reliably sense the logic state of a selected memory with fast access time.

Moreover, since the current sense amplifier circuit is configured to efficiently operate in a manner that is not adversely affected by the bitline capacitance, a relatively large number of memory cells (e.g., 128 SRAM memory cells) to be connected to a global bitline which is connected to the input node of the current sense amplifier circuit, without the need for implementing a hierarchical bitline scheme with local bitlines and/or local amplifiers interconnected to a global bitline, as in conventional memory devices. Indeed, because of the near constant bitline voltage level that is maintained on the bitline during a read operation, the parasitic capacitance of bitline will not have a substantial influence on power consumption or adverse effect on the current sensing reliability of the current sense amplifier circuit, thereby allowing a substantial number of memory cells to be coupled to a single bitline in a given column connected to the input of the current sense amplifier circuit.

Moreover, current sense amplifier circuits according to exemplary embodiments of the disclosure can be utilized with power supply voltages (e.g., VDD) of 0.85 and lower. On the other hand, with voltage sense amplifier circuits, as the power supply voltage decreases, the bitline voltage swing (which is used to detect the logic state of a memory cell) becomes increasingly smaller and approaches a bitline noise level, which renders voltage sense amplifiers ineffective or unusable with such low power supply voltages.

FIG. 3 schematically illustrates a single ended bitline current sense amplifier circuit 300 according to an exemplary embodiment of the disclosure. The current sense amplifier circuit 300 is powered by a positive supply voltage VDD provided on a first supply rail 302 (or VDD rail 302), and a negative supply voltage VSS (e.g., ground voltage) provided on a second supply rail 304 (or VSS rail 304). In some embodiments, the VDD rail 302 provides a supply power of about 1.0V or less (e.g., 0.85V), and the VSS rail 304 is connected to ground voltage (e.g., VSS=0V). The current sense amplifier circuit 300 comprises an input stage 310 and an output stage 320. The input stage 310 comprises PMOS transistors MP1, MP2, and MP3, and NMOS transistors MN1, MN2, MN3, MN4, and MN5. The output stage 320 comprises PMOS transistors MP4, MP5, and MP6, an inverter 322, and NMOS transistors MN6, MN7, and MN8. The input stage 310 comprises an input node 312 (alternatively referred to as bitline node 312), and a sense node 314. The input node 312 is connected to a bitline RBL (e.g., a read bitline RBL of an SRAM array), wherein the bitline is connected to a plurality of memory cells in a given column of a memory array. The input node 312 comprises a low impedance node, and the sense node 314 comprises a high impedance node.

The input stage 310 of the current sense amplifier 300 comprises a current sensing stage which is configured to sense a read current $I_{RBL}$ that flows from the input node 312 to the bitline RBL during a read operation, and generate an analog voltage on the sense node 314 (alternatively referred to herein as sense voltage $V_{SENSE}$) based on a magnitude of the read current $I_{RBL}$. As explained in further detail below, the magnitude of the read current $I_{RBL}$ (which is sunk to the bitline RBL) will vary depending on whether the memory cell which is being read comprises a logic "1" or a logic "0" data value. Exemplary operating modes of the input stage 310 will be discussed in further detail below.

In the input stage 310 of the current sense amplifier 300, the PMOS transistor MP1 comprises a source terminal connected to the VDD rail 302, a drain terminal connected to the sense node 314, and a gate terminal connected to a VB_P bias voltage input node. The PMOS transistor MP2 comprises a source terminal connected to the VDD rail 302, a drain terminal connected to the sense node 314, and a gate terminal connected to a $\overline{RST}$ control input node. The PMOS transistor MP3 comprises a source terminal connected to the VDD rail 302, a drain terminal connected to the bitline node 312, and a gate terminal connected to the sense node 314. The NMOS transistor MN1 comprises a drain terminal connected to the sense node 314, a source terminal connected to the drain terminal of the NMOS transistor MN2, and a gate terminal connected to the RST control input node. The NMOS transistor MN2 comprises a source terminal connected to the bitline node 312, and a gate terminal connected to a VBL bias voltage input node.

Further, the NMOS transistor MN3 comprises a drain terminal connected to the bitline node 312, a source terminal connected to a VB_N bias voltage input node, and a gate terminal connected to an RST control input node. The NMOS transistor MN4 comprises a drain terminal connected to the bitline node 312, a source terminal connected to a drain terminal of MN5, and a gate terminal connected to the VB_N bias voltage input node. The NMOS transistor MN5 comprises a source terminal connected to the VSS rail 304, and a gate terminal connected to the RST control input node, and a gate terminal connected to the $\overline{RST}$ control input node.

The output stage 320 of the current sense amplifier 300 comprises (i) a preamplifier circuit which is configured to amplify the analog voltage on the sense node 314, and (ii) an output latch circuit which is configured to convert the amplified analog voltage to a digital logic level (e.g., rail-to-rail output) and latch an output voltage value (e.g., rail-to-rail output) which represents a logic state of the memory cell which is read during the read operation. In some embodiments, the preamplifier circuit is comprised of the PMOS transistor MP4 and the NMOS transistor MN7, wherein an input of the preamplifier stage (e.g., gate terminal of MP4) is connected to the sense node 314. In some embodiments, the output latch circuit is comprised of the inverter 322, the PMOS transistor MP6, and the NMOS transistor MN6. The latch circuit comprises an input node 324 connected to an input of the inverter 322, and an output node 326 connected to an output of the inverter 322. The output node 326 of the latch circuit comprises an output node $V_{OUT}$ of the current sense amplifier circuit 300. Exemplary operating modes of the output stage 320 will be discussed in further detail below.

More specifically, in the exemplary output stage 320, the PMOS transistor MP4 comprises a source terminal connected to the VDD rail 302, a source terminal connected to the input node 324 of the latch circuit, and a gate terminal connected to the sense node 314. The PMOS transistor MP5 comprises a source terminal connected to the VDD rail 302, a drain terminal connected to a source terminal of MP6, and a gate terminal connected to the RST control input node. The PMOS transistor MP6 comprises drain terminal connected to the input node 324 of the latch circuit, and a gate terminal connected to the output node 326 of the latch circuit. The NMOS transistor MN6 comprises a drain terminal connected to the input node 324 of the latch circuit, a source terminal connected to a drain terminal of MN7, and a gate terminal connected to the output node 326 of the latch circuit. The NMOS transistor MN7 comprises a gate terminal connected to the VB_N bias voltage input node, and a source terminal connected to the VSS rail 304. The NMOS transistor MN8 comprises a drain terminal connected to the input node 324 of the latch circuit, a source terminal connected to the VSS rail 304, and a gate terminal connected to the RST control input node.

In some embodiments, the current sense amplifier circuit 300 is controlled using complementary control signals, denoted RST and $\overline{RST}$ (which are applied on the respective control input nodes RST and $\overline{RST}$), and various DC bias voltages, denoted VB_P, VBL, and VB_N (which are applied to the respective bias voltage input nodes VB_P, VBL, and VB_N). The control signals RST and $\overline{RST}$ are generated to control reset operations of the current sense amplifier circuit 300. As shown in FIG. 3, the control signal RST is applied to the gate terminal of MN3 in the input stage 310, and to the gate terminals of MP5 and MN8 in the output stage 320. The complementary control signal $\overline{RST}$ is applied to the gate terminals of MP2, MN1, and MN5 in the input stage 310.

In some embodiments, during a power down and reset mode of operation (e.g., standby state or hold state) of the current sense amplifier circuit 300, the control signal RST is asserted to logic "1", while the complementary control signal $\overline{RST}$ is asserted to logic "0". On the other hand, during an active mode of operation (e.g., read operation) of the current sense amplifier circuit 300, the control signal RST is asserted to logic "0", while the complementary control signal $\overline{RST}$ is asserted to logic "1". It is to be understood that the terms "standby state" and "reset state" and "hold state" and "power down state" are alternatively used herein to refer to an non-read mode of operation of the current sense amplifier circuit 300 in which various nodes of the current sense amplifier circuit 300 (e.g., nodes 314, 324, 326) are reset to target voltage levels, and various quiescent currents (e.g., $I_{SENSE}$ and $I_{BIAS}$) are turned OFF to reduce the power consumption of the current sense amplifier circuit 300.

In some embodiments, the DC bias voltages VB_P, VBL, and VB_N are generated by a control system (e.g., the master (shared) DC bias voltage generator circuitry 170, FIG. 1) which provides the DC bias voltages VB_P, VBL, and VB_N to all current sense amplifier circuits in the memory array. As shown in FIG. 3, the bias voltage VB_P is applied to the gate terminal of the PMOS transistor MP1, the bias voltage VBL is applied to the gate terminal of the NMOS transistor MN2, and the bias voltage VB_N is applied to gate terminals of the NMOS transistors MN4 and MN7. In some embodiments, as noted above, the DC bias voltage generator circuitry 170 (FIG. 1) is digitally programmable and configurable to compensate for bitline leakage and to adjust a sensitivity of the current sense amplifier circuit 300, wherein the DC bias voltage generator circuitry 170 is configured to adjust the DC bias voltages (VB_N, VB_P, VBL) for optimum sensitivity of the current sense amplifier circuit 300. In some embodiments, the DC bias voltages are adjusted to compensate for leakage current which flows from the input node 312 to the bitline RBL and to ensure that the voltages at the input node 312 and the sense node 314 are maintained at relatively constant target levels to ensure proper operation of the current sense amplifier 300.

In the input stage 310 of the current sense amplifier 300, the PMOS transistor MP1 operates as a current source to generate a sense current $I_{SENSE}$ which flows in a current sensing path between the sense node 314 and the bitline node 312. The bias voltage VB_P (which is applied to the gate terminal of MP1) provides a bias voltage for setting a gate-to-source voltage ($V_{GS}$=(VB_P–VDD)) of the PMOS transistor MP1 to drive MP1 to an ON state, wherein MP1 operates a current source to generate the sense current $I_{SENSE}$ when the input stage 310 is in an active mode of operation (e.g., read mode). In the active mode of operation, the PMOS transistor MP1 is configured to operate in a saturation mode wherein the drain-to-source voltage $V_{DS}$ of MP1 in saturation mode is at a level of $V_{DS} \geq V_{GS} - V_{T,MP1}$, where $V_{T,MP1}$ denotes a threshold voltage of MP1, and where $V_{DS}$ of MP1 is determined as $V_{DS,MP1} = V_{SENSE} - VDD$. As explained in further detail below, during a read operation, the magnitude of the sense current $I_{SENSE}$ will vary depending on whether a logic "0" or logic "1" is read from a memory cell connected to the bitline RBL that is connected to the bitline node 312.

In some embodiments, the bias voltage VBL is applied to the gate terminal of the NMOS transistor MN2 to bias MN2 for operation and to apply a constant target bias voltage (e.g., precharge voltage) to the RBL connected to the bitline node 312. In some embodiments, the second bias voltage VBL is adjusted to maintain a bias voltage of about VDD/2 at the input node 312 (e.g., maintain read bitline RBL at a static voltage level of above VDD/2). Moreover, in some embodiments, the bias voltage VB_P applied to the gate terminal of the PMOS transistor MP1, together with the bias voltage VB_N applied to the gate terminals of the NMOS transistors MN4 and MN7, serves to set an operating point of the input stage 310 and the output stage 320.

More specifically, in the input stage 310 (e.g., current sensing stage), the quiescent current $I_{BIAS}$ is set by the bias voltages VB_P and VB_N applied to the gate terminals of MP1 and MN4, respectively. In the input stage 310, the quiescent current $I_{BIAS}$ flows in a bias current path between the bitline node 312 and the VSS rail 304. The quiescent current $I_{BIAS}$ in the input stage 310 is mirrored in the output stage 320 by the bias voltage VB_N applied to the gate terminal of the MMOS transistor MN7, wherein the mirrored quiescent current $I_{BIAS}$ flows through MN7. The bias voltages VB_P and VB_N (which are applied on the respective bias voltage input nodes) are adjusted to compensate for a leakage current (e.g., adjust the leakage current immunity) and to obtain a bias current required for adjusting the bias voltage of the read bitline RBL and setting an operating point of the input stage (e.g., current sensing stage). The design is optimized using the read current of the weakest SRAM cell in the array (e.g., for 128 SRAM cells connected to a given global read bitline RBL, the total leakage current amounts to 128 times the leakage current of each individual SRAM cell connected to the given RBL).

While the NMOS transistor MN4 is configured to control amount of the quiescent current $I_{BIAS}$ which flows in the bias current path between the bitline node 312 and the VSS rail 304, the NMOS transistor MN5 is configured to control a power down state of the sense amplifier circuit 300 by selectively shutting down the flow of the quiescent current $I_{BIAS}$ in the bias current path in response to the assertion of a logic "0" control signal $\overline{RST}$ applied to the gate terminal of MN5. Advantageously, the implementation of the transistor MN5 in the bias current path enables deactivation of the transistor MN5 to cut off the flow of quiescent operating current of the sense amplifier circuit 300 during a standby mode when no read operations are being performed, to thereby provide decreased power consumption of the sense amplifier circuit 300 during the standby mode.

In the exemplary embodiment of FIG. 3, the transistors MN1, MN2, and MP3 comprise a "shunt-shunt" feedback circuit (or shunt voltage feedback circuit) which operates as a current-voltage controlled negative feedback system. In the exemplary feedback circuit configuration, the transistors MN1 and MN2 are serially connected between the bitline node 312 and the sense node 314, wherein the transistors MN1 and MN2 comprise a current sensing path of the feedback circuit. The transistors MN1 and MN2 form a cascode framework in which MN2 operates as common gate amplifier with MN2 as a cascode device. In addition, the PMOS transistor MP3 operates as a common source amplifier which is controlled by the voltage on the sense node 314 to provide a feedback current path from the VDD rail 302 to the bitline node 312 through the transistor MP3 when the transistor MP3 is turned ON.

In the shunt-shunt feedback circuit configuration, the sense voltage $V_{SENSE}$ on the sense node 314 is sensed by the PMOS transistor MP3, and when the sense voltage $V_{SENSE}$ is at a certain level, the transistor MP3 is driven to an ON state and generates a read current $I_{READ}$ which is fed to the bitline node 312. In particular, the PMOS transistor MP3 will turn on when $V_{DS}$ of MP1 reaches the threshold voltage of MP3. Otherwise, when the magnitude of the sense voltage $V_{SENSE}$ is close to VDD, the transistor MP3 will be in an OFF state, and no read current $I_{READ}$ is generated by MP3. As explained in further detail below, the voltage $V_{SENSE}$ on the sense node 314 is amplified by the PMOS transistor MP4 in the output stage, and the resulting amplified signal is provided to the output latch to provide logic 0 and 1 levels at the output node 326, depending on the logic state of the memory cell which sensed by the sense amplifier circuit 300.

In FIG. 3, the shunt-shunt negative feedback circuit formed by the transistors MN1, MN2, and MP3 serves to reduce the input impedance of the input node 312 (which is connected to the bitline RBL) and to provide relatively high isolation between the sense node 314 and the input node 312, which minimizes the capacitive coupling between the nodes 314 and 312. In particular, the cascode-connected pair of transistors MN1 and MN2 is configured to isolate the bitline node 312 from an occurrence of a voltage variation on the sense node 314. Advantageously, the implementation of the cascode-connected pair of transistors MN1 and MN2 in the feedback circuit serves to isolate the bitline node 312 from the sense node 314 and prevent transient changes and ripples of the sense voltage on the sense node 314, which occur during operation of the sense amplifier circuit 300, from propagating to the bitline node and adversely affecting a precharge voltage level (e.g., VDD/2) on the bitline connected to the bitline node 312. This approach allows the connection of multiple memory cells to the bitline RBL without reducing bandwidth.

Further, in the exemplary embodiment of FIG. 3, the NMOS transistor MN1 is configured to control a power down state of the sense amplifier circuit 300 by selectively shutting down the flow of the sense current $I_{SENSE}$ in the current sensing path (between the sense node 314 and the bitline node 312) in response to the assertion of a logic "0" control signal $\overline{RST}$ applied to the gate terminal of MN1. Advantageously, the implementation of the transistor MN1 in the current sensing path of the feedback circuit enables deactivation of MN1 to cut off the flow of operating current of the sense amplifier circuit 300 during a standby mode when no read operations are being performed, to thereby provide decreased power consumption of the sense amplifier circuit 300 during the standby mode.

The quiescent current $I_{BIAS}$ that is generated in the bias current path (between the bitline node 312 and the VSS rail 304) in the input stage 310 comprises a small fraction of the full-scale dynamic current for low power operation and will remain substantially constant when the current sense amplifier 300 is activated during read operations irrespective of the logic state of the memory cell being read. The transistor MP1 will generate a sense current $I_{SENSE}$ to support $I_{BIAS}$ as well as a small amount of leakage current $I_{LEAK}$ which may flow from the input node 312 to the bitline RBL, i.e., $I_{SENSE}=I_{DS,\ MP1}=I_{LEAK}+I_{BIAS}$. More specifically, the sense current $I_{SENSE}$ that is generated by the PMOS transistor MP1 (i.e., the resistive current $I_{DS}$ between the drain and the source of MP1) will be equal to $I_{LEAK}+I_{BIAS}$ in instances when the current sense amplifier 300 is in an active state and ready for a read operation.

When a read operation (denoted READ-0 operation) is performed in which the memory cell being read has a logic "0" state on the storage node N2 (which means that the memory cell being read has a stored data value of logic "1"), the read transistor 214 (FIG. 2) is in an OFF state, and no current path is generated from the read bitline RBL to ground (VSS) through the first and second read transistors 214 and 215. In this instance, no read bitline current $I_{RBL}$ flows from the input node 312 of the input stage 310 to the read bitline RBL, such that $I_{RBL}=0$, except for a small amount of leakage current $I_{LEAK}$ that flows to the read bitline RBL due to leakage of the SRAM memory cells coupled to the read bitline RBL. For proper evaluation of the logic state of the memory cell for the READ-0 operation, the value of $I_{DS,sat\ MP1}>I_{LEAK}+I_{BIAS}$. Further, a margin for the READ-0 operation is determined as: margin_0=$V_{T,MP3,\ MP4}-V_{DS,sat,\ MP1}$, where $V_{T,MP3,\ MP4}$ denotes the threshold voltage of the PMOS transistors MP3 and MP4, and where $V_{DS,sat,\ MP1}$ denotes the $V_{DS}$ of MP1 in which MP1 operates in saturation mode where $V_{GS}>V_T$ and $V_{DS}\geq(V_{GS}-V_T)$.

On the other hand, the transistor MP1 will generate a higher level sense current $I_{SENSE}$ when a read operation (denoted READ-1 operation) is performed in which the memory cell being read has a logic "1" state on the storage node N2 (which means that the memory cell being read has a stored data value of logic "0"). For the READ-1 operation, the read transistor 214 (FIG. 2) is in an ON state, and the activation of the first and second read transistors 214 and 215 creates a path from the read bitline RBL to ground (VSS) through the first and second read transistors 214 and 215, which causes read bitline current IRL to flow from the input node 312 of the input stage 310 to the read bitline RBL. In this instance, the read bitline current $I_{RBL}$ will have a sufficient magnitude which is greater than the leakage current. In particular, $I_{RBL}=I_{SENSE}+I_{READ}-I_{BIAS}$, where $I_{SENSE}=I_{DS,\ MP1}$, and where $I_{READ}$ is the current that is generated by activation of the transistor MP3, and which flows in the feedback path through MP3 from the VDD rail 302 to the input node 312 to source the current that is needed to maintain the bias voltage level on RBL (e.g., VDD/2).

For the READ-1 operation, the level of $I_{SENSE}$ will initially increase to source the RBL current for the read operation, until the sense voltage on the sense node 314 falls to a level below VDD which reaches the threshold voltage of MP3, whereby activation of the transistor MP3 generates the feedback current $I_{READ}$ which flows to the bitline RBL. For a READ-1 operation, the PMOS transistor MP3 generates a current that is substantially equal to $I_{READ}=I_{RBL}-I_{BIAS}$. For a proper evaluation of the logic state of the memory cell for a READ-1, a read margin is determined as: margin_1=$V_{DS,max,MP1}-V_{T,MP3,MP4}$, where $V_{DS,max,MP1}$ denotes the drain-source voltage of MP1 for the READ-1 operation, which is significantly higher than $V_{DS,sat,MP1}$.

FIG. 4 schematically illustrates a single ended bitline current sense amplifier circuit, according to another exemplary embodiment of the disclosure. In particular, FIG. 4 schematically illustrates a single ended bitline current sense amplifier circuit 400 which is similar the single ended bitline current sense amplifier circuit 300 of FIG. 3, except that the single ended bitline current sense amplifier circuit 400 has an input stage 410 in which the series connection of the NMOS transistors MN1 and MN2 is different. As shown in FIG. 4, the NMOS transistor MN2 has the drain terminal connected to the sense node 314 of the input stage 410, and the source terminal connected to the drain terminal of the cascode NMOS transistor MN1, and the source terminal of MN1 is connected to the input node 312. This configuration of the feedback circuit does not change the current transfer function as compared to the configuration of the feedback circuit shown in FIG. 3.

Figure 5A:
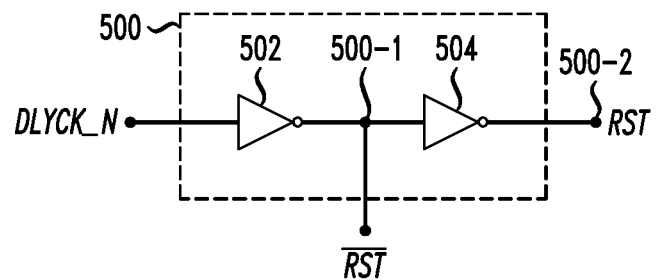
FIG. 5A schematically illustrates a circuit that is configured to generate control signals for controlling operating modes of a current sense amplifier, according to an exemplary embodiment of the disclosure.

FIG. 5A schematically illustrates a circuit that is configured to generate control signals for controlling operating modes of a current sense amplifier, according to an exemplary embodiment of the disclosure. More specifically, FIG. 5A schematically illustrates a control circuit 500 which is configured to generate complementary control signals RST and $\overline{RST}$ to control standby and active (read) modes of the exemplary current sense amplifiers 300 and 400 discussed above. The control circuit 500 comprises a first inverter 502 and a second inverter 504, which are serially connected, wherein an output of the first inverter 502 is connected to an input of the second inverter 504 at a first output node 500-1 of the control circuit 500. In some embodiments, the first and second inverters 502 and 504 each comprise a CMOS inverter circuit.

A digital control signal, denoted DLYCK_N, is input to the first inverter 502. The first inverter 502 inverts the digital control signal DLYCK_N to generate the control signal RST on at the output of the first inverter 502 on the first output node 500-1 of the control circuit 500. The second inverter 502 inverts the control signal $\overline{RST}$ to generate the control signal RST at the output of the second inverter 504 on a second output node 500-2 of the control circuit 500. In some embodiments, the first output node 500-1 of the control circuit 500 is coupled to the gate terminals of the transistors MP3, MN1, and MN5 of the current sense amplifier circuits 300 and 400, and the second output node 500-2 is coupled to the gate terminals of the transistors MP5, MN3, and MN8 of the current sense amplifier circuits 300 and 400.

Figure 5B:
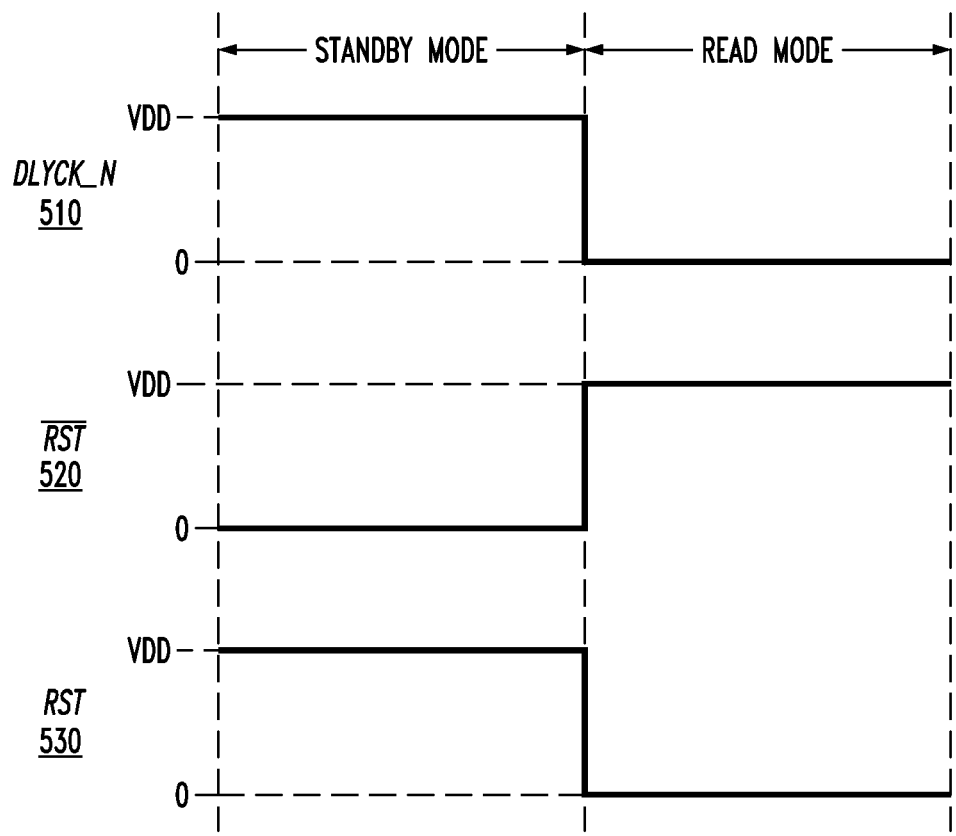
FIG. 5B depicts a timing diagram of control signals for controlling standby and active modes of a current sense amplifier circuit using the control circuit of FIG. 5A, according to an exemplary embodiment of the disclosure.

FIG. 5B depicts a timing diagram of control signals for controlling standby and active modes of a current sense amplifier circuit using the control circuit of FIG. 5A, according to an exemplary embodiment of the disclosure. In particular, FIG. 5B illustrates an exemplary input digital control signal 510 (DLYCK_N), and complementary control signals 520 and 530 (e.g., $\overline{RST}$ and RST) which are generated by the control circuit 500 in response to the input digital control signal DLYCK_N 510. As shown in FIG. 5B, in some embodiments, the digital control signal DLYCK_N 510 is asserted to VDD (e.g., logic "1", active high) for a standby mode, and deasserted to logic "0" (e.g., VSS=0) for a read mode.

The digital control signal DLYCK_N can be derived in one of many ways. For example, in some embodiments, the digital control signal DLYCK_N is derived from a read wordline (RWL) control signal. More specifically, in some embodiments, the digital control signal DLYCK_N is generated through a local clock buffer which tracks a read clock signal that generates a RWL signal. In other embodiments, the digital control signal DLYCK_N is generated from a local read clock with appropriate timing with respect to a RWL signal. In this regard, in some embodiments, the digital control signal DLYCK_N 510 comprises an inverted RWL signal, such that when the RWL signal is logic "0" (and no read operation will be performed), the digital control signal DLYCK_N 510 is asserted to VDD. On the other hand, then the RWL signal is asserted to logic "1" (to perform a read operation), the digital control signal DLYCK_N 510 is deasserted to logic "0" to enable a read operating mode of the current sense amplifier.

As further shown in FIG. 5B, in the standby mode, the control signal $\overline{RST}$ 520 is held at logic "0" (e.g., VSS=0) and the control signal RST 530 is held at logic "1" (VDD). In response to the logic "0" control signal $\overline{RST}$ 520, the transistors MN1 and MN5 in the bias current path of the current sense amplifier circuit 300 are driven to an OFF state, and the transistor MP2 is driven to an ON state. In this instance, with the transistors MN1 and MN5 in the OFF state, no bias current flows in the bias current path of the current sense amplifier circuit, thereby reducing power consumption of the current sense amplifier circuit during the standby mode. In addition, with the transistor MP2 in the ON state, the sense node 314 is connected to the VDD rail 302 and essentially pre-charged to VDD. With the sense node 314 held at VDD, the transistor MP4 in the output stage 320 is driven to an OFF state (as the gate terminal of MP4 is connected to the sense node 314).

Furthermore, in the standby mode, in response to the logic "1" control signal RST 530, the transistors MN3 and MN8 are driven to an ON state, and the transistor MP5 is driven to an OFF state. In this instance, the transistor MN3 (e.g., hold transistor) connects the VB_N bias voltage input node to the bitline RBL (connected to the input node 312) to hold the input node 312 at a level of the bias voltage VB_N. In addition, with the transistor MP5 in an OFF state and the transistor MN8 in an ON state, the input node 324 to the inverter 322 is pulled down to VSS (e.g., 0V) which causes the output node 326 ($V_{OUT}$) of the inverter 322 to be maintained at VDD.

As further shown in FIG. 5B, the current sense amplifier circuit is enabled for a read mode of operation (or active mode) when the digital control signal DLYCK_N is deasserted (e.g., transitions to logic "0"), which causes the control signal $\overline{RST}$ 520 to transition to logic "1" (e.g., VDD) and causes the control signal RST 530 to transition to logic "0" (e.g., VSS=0). In response to the logic "1" control signal $\overline{RST}$ 520, the transistors MN1 and MN5 in the bias current path of the current sense amplifier circuit 300 are activated to an ON state, and the transistor MP2 is deactivated to an OFF state. In this instance, with the transistors MN1 and MN5 in the ON state, current flows in the bias current path of the current sense amplifier circuit, thereby enabling the current sense amplifier circuit for a read operation. In addition, with the transistor MP2 in the OFF state, the sense node 314 is disconnected from the VDD rail 302.

Furthermore, in the read mode, in response to the logic "0" control signal RST 530, the transistors MN3 and MN8 are deactivated to an OFF state, and the transistor MP5 is activated to an ON state. In this instance, the deactivation of the transistor MN3 causes the VB_N bias voltage input node to be disconnected from the input node 312 (e.g., RBL), thereby allowing voltage on the input node 312 (RBL) to transition back to the target precharge voltage (e.g., VDD/2) as a result of the bias current flowing in the bias current path. Further, the deactivation of the transistor MN3 causes the VSS rail to be disconnected (at least initially) from the input node 324 of the inverter 322 in the output stage 320. In addition, the logic "0" RST signal applied to the gate terminal of the transistor MP5 places MP5 in an ON state to enable operation of the output latch circuit during a read operation.

Figure 7:
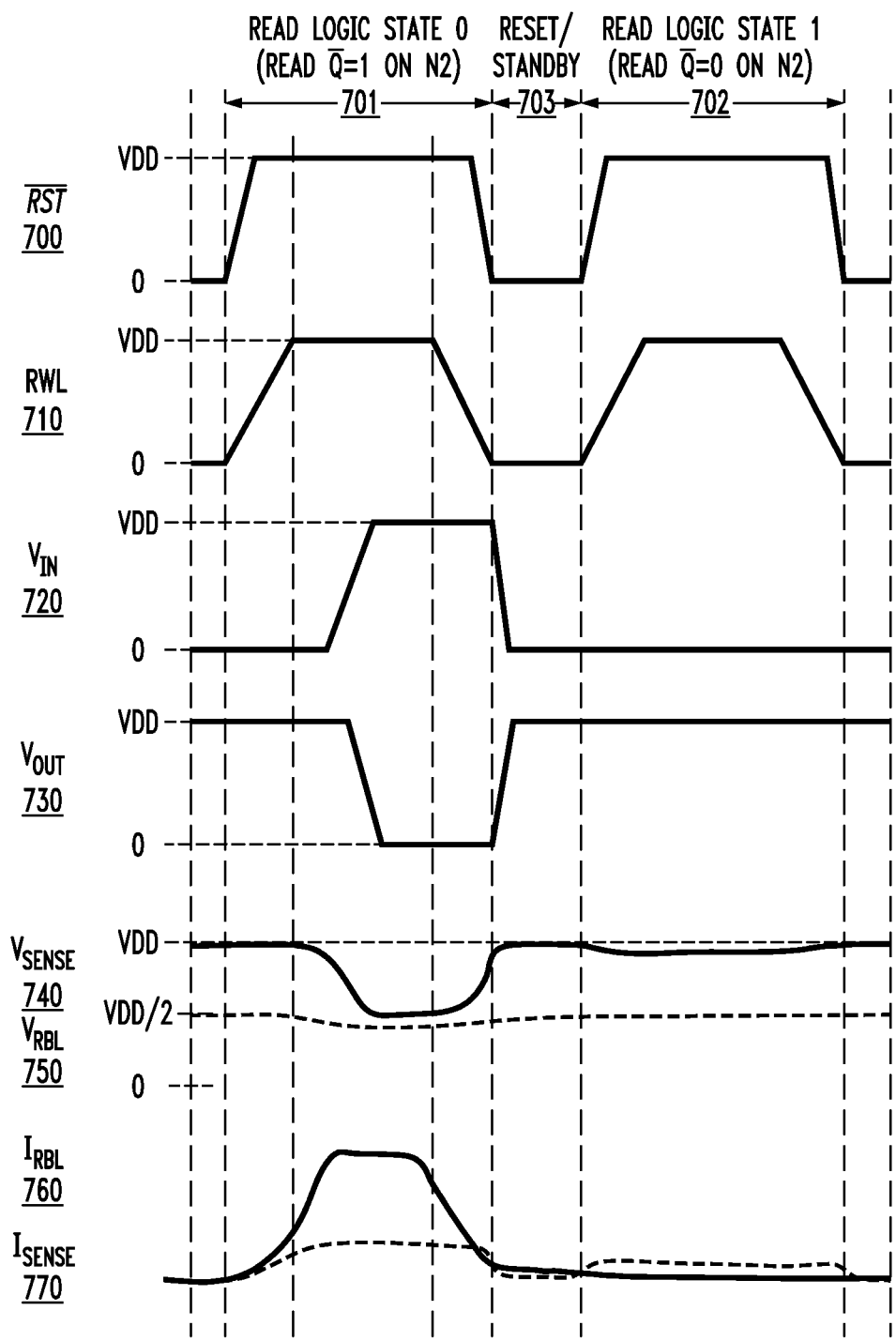
FIG. 7 depicts a timing diagram of signals which illustrate read and reset operations of a single ended bitline current sense amplifier circuit, according to an exemplary embodiment of the disclosure.

FIGS. 6A, 6B, and 7 schematically illustrate methods for performing read operations using a single ended bitline current sense amplifier circuit according to an exemplary embodiment of the disclosure. In particular, FIG. 6A schematically illustrates a method for performing a read operation using a single ended bitline current sense amplifier circuit 600 when a memory cell 610 stores a logic "1" value, and FIG. 6B schematically illustrates a method for performing a read operation using the single ended bitline current sense amplifier circuit 600 when the memory cell 610 stores a logic "0" value. Further, FIG. 7 depicts timing diagrams of various signals that are generated when performing read operations using a single ended bitline current sense amplifier circuit, according to an exemplary embodiment of the disclosure.

In some embodiments, the single ended bitline current sense amplifier circuit 600 in FIGS. 6A and 6B is implemented using the current sense amplifier circuit 300 of FIG. 3 or the current sense amplifier circuit 400 of FIG. 4. Further, in some embodiments, the memory cell 610 comprises an SRAM cell having the exemplary 8T SRAM architecture of the memory cells 210 shown and discussed above in conjunction with FIG. 2. For illustrative purposes, only those elements of the 8T SRAM memory cell that are utilized to perform a read operation are shown in the memory cells 610 of FIGS. 6A and 6B. For illustrative purposes, the exemplary read operations will be explained with regard to reading the logic state of an 8T SRAM memory cell 610 using the current sense amplifier circuit 300 of FIG. 3.

FIG. 6A schematically illustrates a method for performing a read operation using the single ended current sense amplifier circuit 600 when the memory cell 610 stores a logic "1" value, wherein Q=1 at node N1, and $\overline{Q}$=0 at node N2 of the SRAM memory cell 610. When the current sense amplifier circuit 600 is enabled for a read operating mode, the current sense amplifier circuit 600 will pre-charge the global bitline RBL to a pre-charge voltage of about VDD/2. For the read operation, the read wordline RWL is asserted to VDD which drives the read access transistor 215 to an ON state. Since the value $\overline{Q}$=0 at node N2 (meaning that the memory cell 610 has a logic state of logic Q=1), the read transistor 214 will be in an OFF state. As such, no current path is generated from the read bitline RBL to ground (VSS) through the read transistors 214 and 215 and, therefore, no read bitline current IRL flows from the input node of the current sense amplifier circuit 600 to the read bitline RBL, i.e., $I_{RBL}$=0 (except for a small amount of leakage current).

On the other hand, FIG. 6B schematically illustrates a method for performing a read operation using the single ended current sense amplifier circuit 600 when the memory cell 610 stores a logic "0" value, wherein $\overline{Q}$=0 at node N1, and Q=1 at node N2 of the SRAM memory cell 610. Again, when the current sense amplifier circuit 600 is enabled for a read operating mode, the current sense amplifier circuit 600 will pre-charge the global bitline RBL to a pre-charge voltage of about VDD/2. For the read operation, the read wordline RWL is asserted to VDD which drives the access transistor 215 to an ON state. Since the value $\overline{Q}$=1 at node N2 (meaning that the memory cell 610 has a logic state of logic Q=0), the read transistor 214 will be driven to an ON state. As such, the activation of the read transistors 214 and 215 creates a path from the read bitline RBL to ground (VSS) through the read transistors 214 and 215, which causes read bitline current $I_{RBL}$ to flow from the input node of the current sense amplifier circuit 600 on the read bitline RBL, wherein the read bitline current $I_{RBL}$ will be equal to $I_{READ}$ (plus a small amount of leakage current).

The exemplary read operations of FIGS. 6A and 6B will be discussed in further detail with reference to the exemplary timing diagrams of FIG. 7 and the current sense amplifier circuit 300 of FIG. 3. In particular, FIG. 7 illustrates timing diagrams of various control signals that are applied to the current sense amplifier circuit 300 and various current and voltage signals that are generated by the current sense amplifier circuit 300 during read operations. For example, FIG. 7 depicts a control signal $\overline{RST}$ 700, a read wordline signal RWL 710, an input voltage signal VIN 720, an output voltage signal $V_{OUT}$ 730, a voltage signal $V_{SENSE}$ 740, a read bitline voltage signal $V_{RBL}$ 750, a read bitline current signal $I_{RBL}$ 760, and a sense current signal $I_{SENSE}$ 770. The control signal $\overline{RST}$ 700 depicts an exemplary control signal that is applied to the gate terminals of the cascode transistor MN1, the foot transistor MN5, and the precharge transistor MP2 as depicted in FIG. 3. The read wordline signal RWL 710 depicts an exemplary read wordline control signal that is applied to the read wordline RWL shown in FIGS. 6A and 6B. The input voltage signal VIN 720 and the output voltage signal $V_{OUT}$ 730 depict exemplary voltage signals that are generated on the input and output nodes 324 and 326, respectively, of the inverter 322 in the output stage 320 of the current sense amplifier circuit 300.

Further, the voltage signal $V_{SENSE}$ 740 depicts an exemplary voltage signal that is generated on the sense node 314 in the input stage 310 of the current sense amplifier circuit 300. The voltage signal VBL 750 depicts an exemplary voltage signal that is generated at the input node 312 (which is connected to the read bitline RBL) in the input stage 310 of the current sense amplifier circuit 300. For ease of illustration, the voltage signals $V_{SENSE}$ 740 and VBL 750 are superimposed on the same graph, wherein the voltage signal $V_{SENSE}$ 740 is depicted as a solid line, and the voltage signal VBL 750 is depicted as a dashed line. The current signal $I_{RBL}$ 760 depicts an exemplary current signal which flows from the input node 312 to the read bitline RBL during a read operation. The current signal $I_{SENSE}$ 770 depicts an exemplary current signal which is generated by the current source transistor MP1 and flows in bias current path in the input stage 310 of the current sense amplifier circuit 300. For ease of illustration, the current signals $I_{RBL}$ 760 and $I_{SENSE}$ 770 are superimposed on the same graph, wherein the current signal $I_{RBL}$ 760 is depicted as a solid line, and the current signal $I_{SENSE}$ 770 is depicted as a dashed line.

In FIG. 7, the various signals 700, 710, 720, 730, 740, 750, 760, and 770 show the waveforms that are generated for (i) a first read operation 701 (e.g., FIG. 6B) for reading a logic state of "0" of the memory cell 610 where $\overline{Q}$=1 at node N2 of the SRAM memory cell 610, (ii) a second read operation 702 (e.g., FIG. 6A) for reading a logic state of "1" of the memory cell 610 where $\overline{Q}$=0 at node N2 of the SRAM memory cell 610, and (iii) a reset/standby operating mode 703 that is performed between the first and second read operations 701 and 702.

The first read operation 701 begins with the control signal $\overline{RST}$ 700 transitioning to a logic "1" level. As noted above, in some embodiments, prior to the read operation 701, the current sense amplifier 300 is in a standby mode where, e.g., (i) the sense voltage $V_{SENSE}$ 740 on the sense node is pre-charged to VDD, (ii) the read bitline voltage $V_{RBL}$ 750 is held at bias voltage VB_N, (iii) the input voltage VIN 720 at the input node 324 of the inverter 322 is held at VSS (e.g., 0V) which causes the output voltage $V_{OUT}$ 730 at the output node 326 of the inverter 322 to be maintained at VDD, and (iv) the current $I_{SENSE}$ 770 is 0 (since the transistors MN1 and MN5 are in an OFF state).

The transitioning of the control signal $\overline{RST}$ 700 to a logic "1" level causes the transistors MN1 and MN5 to be turned ON, and the transistor MP2 to be turned OFF. As such, a small sense current $I_{SENSE}$ 770 is generated in the bias current path to support the quiescent current $I_{BIAS}$ and a small amount of leakage current on the RBL, and the sense node 314 is disconnected from the VDD rail 302. Furthermore, the hold transistor MN3 is driven to an OFF state, and the read bitline voltage $V_{RBL}$ 750 is charged to its operating bias voltage, which is approximately VDD/2.

As schematically illustrated in FIG. 7, the control signal $\overline{RST}$ 700 transitions to the logic "1" level (VDD) prior to the read wordline voltage RWL 710 being asserted to the logic "1" level (VDD). This is to ensure that the current sense amplifier circuit 300 initialized and enabled for the read operation. When RWL 710 transitions to VDD, the read access transistor 215 (FIG. 6B) is driven to an ON state, and the read transistor 214 is driven to an ON state by $\overline{Q}$=1 at node N2 of the SRAM memory cell 610. As such, a read bitline current $I_{RBL}$ 760 begins to flow from the input node 312 of the current sense amplifier circuit 300 to the read bitline RBL and to ground (VSS) through current path of the activated read transistors 214 and 215. In this instance, with one end of the read bitline RBL effectively coupled to VSS via the activation of the read transistors 214 and 215, the current sense amplifier 300 is configured to generate a current $I_{RBL}$ 760 on the read bitline RBL to maintain the read bitline voltage $V_{RBL}$ 750 (at the input node 312 connected to RBL) at the equilibrium bias voltage level (e.g., about VDD/2).

Initially, the read bitline current $I_{RBL}$ 760 is sourced by an increase in the sense current $I_{SENSE}$ 770 generated by the PMOS transistor MP1 (operating as a current source). For example, with the PMOS transistor MP1 operating in a saturation mode (via the bias voltage VB_P), the sense current $I_{SENSE}$ 770 will slightly increase to a maximum level which corresponds to the $I_{DS}$ saturation current of MP1. This increase in the sense current $I_{SENSE}$ 770 is due to an increase in $V_{DS}$ of the transistor MP1 which occurs as a result of the decrease in the sense voltage $V_{SENSE}$ 740 (on the sense node 314) which happens when the RWL is initially asserted and the RBL is coupled to VSS in the memory cell 610. As the sense voltage $V_{SENSE}$ 740 (on the sense node 314) decreases from VDD towards the read bitline voltage $V_{RBL}$ 750, at some point, the sense voltage $V_{SENSE}$ 740 on the sense node 314 decreases to a level below VDD where a potential difference $V_{SENSE}$–VDD reaches a threshold voltage of the transistor MP3, which causes MP3 to turn ON.

When the transistor MP3 is turned ON, the transistor MP3 will generate the read current $I_{READ}$ at a level which is sufficient to maintain the read bitline voltage $V_{RBL}$ 750 at the target bias voltage level (e.g., about VDD/2). For example, as shown in FIG. 7, the read bitline current signal $I_{RBL}$ 760 increases to a level which is greater than the level of the sense current signal $I_{SENSE}$ 770 generated by the transistor MP3 in the bias current path.

In the output stage 320, the PMOS transistor MP4 will also turn ON (along with MP3) when the sense voltage $V_{SENSE}$ 740 on the sense node 314 decreases to a level below VDD, where the potential difference $V_{SENSE}$–VDD reaches a threshold voltage of the PMOS transistor MP4. In some embodiments, when the transistor MP4 is turned ON, the read current $I_{READ}$ which is generated by the transistor MP3 (in the input stage 310) is mirrored by the transistor MP4, such that the mirrored read current $I_{READ}$ serves to charge the input node 324 and increase the voltage input voltage VIN 720. In some embodiments, the PMOS transistor MP4 and the NMOS transistor MN7 comprise a preamplifier stage, wherein MP4 comprises a common source preamplifier device which amplifies the sense voltage $V_{SENSE}$ and MN7 serves as an active load of the preamplifier stage (when the $I_{DS}$ current of MP4 is greater than the saturation $I_{DS}$ current of MN7).

Again, as noted above, at the beginning of the read operation 701, the control voltage RST transitions to logic "0" (e.g., VSS=0), wherein the PMOS transistor MP5 is driven to an ON state, and the NMOS transistor MN8 is driven to an OFF state. Moreover, at the beginning of the read operation 701, the input voltage VIN 720 at the input node 324 of the inverter 322 is at logic "0" (e.g., VSS=0) and the output voltage $V_{OUT}$ 730 at the output node 326 of the inverter 322 is at logic "1" (e.g., VDD). In this initial state, since the gate terminal of the transistor MN6 is driven by VDD at the output node 326, the transistor MN6 is in an ON state. Furthermore, in this initial state of the read operation, with the NMOS transistor MN8 in an OFF state, the transistor NM7 acts as a weak keeper to keep the voltage VIN 720 on the input node 324 at VSS, as long as MP4 is turned OFF or is very weakly conducting.

When the transistor MP4 is turned ON (e.g., operating in saturation mode), the input node 324 of the inverter 322 is coupled to the VDD rail 302 (via the transistor MP4), and the current flow in the path through the transistors MP4, MN6, and MN7 causes the input voltage VIN 720 at the input node 324 of the inverter 322 to increase to VDD. When the input voltage VIN 720 at the input node 324 of the inverter 322 reaches a switching threshold of the inverter 322, the output voltage $V_{OUT}$ 730 switches to a logic "0" level (e.g., VSS=0). As the output voltage $V_{OUT}$ 730 at the output node 326 of the inverter 322 decreases to 0, at some point, the transistor MP6 is turned ON and the transistor MN6 is turned OFF, thereby creating a positive feedback loop provided by the inverter 322 and the transistor MP6, which continues to increase the input voltage VIN 720 at the input node 324 of the inverter 322 until the input voltage VIN reaches logic level "1" (VDD). The positive feedback loop configuration allows the output stage 320 to hold its state (VDD) even if there is a change in the input.

At the completion of the read operation 701, the output voltage $V_{OUT}$ 730 of the output stage 320 of the current sense amplifier 300 will be logic "0" (e.g., VSS=0) which is representative of the logic "0" state (Q=0) of the memory cell 610 (FIG. 6B). Following the read operation 701, as the read wordline voltage RWL 710 is deasserted to logic "0", the control signal RST 700 transitions to logic "0" (and the control signal $\overline{RST}$ transitions to logic "1"), thereby initiating the reset/standby operating mode 703 of the current sense amplifier 300. As noted above, in the reset/standby mode, the PMOS transistor MP2 in the input stage 310 is driven to an ON state which causes the sense voltage $V_{SENSE}$ 740 to increase to VDD (since the sense node 314 is coupled to the VDD rail 302 when MP2 is turned ON). Furthermore, in the output stage 320, the transistor MP5 is driven to an OFF state, and the transistor MN8 is driven to an ON state, which causes the input node 324 of the inverter 322 to be coupled to the VSS rail 304 (via the transistor MN8), which, in turn, causes the input voltage VIN 720 at the input node 324 of the inverter 322 to transition to logic "0" (VSS) and the output voltage $V_{OUT}$ 730 at the output node 326 to transition to logic "1" (VDD).

The second read operation 701 begins with the control signal $\overline{RST}$ 700 transitioning to a logic "1" level, and the read wordline voltage RWL 710 being asserted to the logic "1" level (VDD). As noted above, the transitioning of the control signal $\overline{RST}$ 700 to a logic "1" level causes the transistors MN1 and MN5 to turn ON, and the transistor MP2 to turn OFF. As such, a small sense current $I_{SENSE}$ 770 is generated in the bias current path to support the quiescent current $I_{BIAS}$ and a small amount of leakage current on the RBL, and the sense node 314 is disconnected from the VDD rail 302. Furthermore, the hold transistor MN3 is driven to an OFF state, and the read bitline voltage $V_{RBL}$ 750 is charged to its operating bias voltage, which is approximately VDD/2.

When RWL 710 transitions to VDD, the read access transistor 215 (FIG. 6A) is driven to an ON state, but the read transistor 214 is maintained in an OFF state by $\overline{Q}$=0 at node N2 of the SRAM memory cell 610. In this instance, as noted above, no current path is generated from the read bitline RBL to ground (VSS) through the read transistors 214 and 215 and, therefore, no read bitline current $I_{RBL}$ flows from the input node of the current sense amplifier circuit 600 to the read bitline RBL, i.e., $I_{RBL}$=0, except for a small amount of leakage current.

As shown in FIG. 7, the sense current $I_{SENSE}$ 770 will slightly increase to accommodate for leakage current which flows from the input node 312 to the read bitline RBL (e.g., $I_{SENSE}$=$I_{LEAK}$+$I_{BIAS}$). However, while the sense voltage $V_{SENSE}$ 740 on the sense node 314 may slightly decrease due to the slight increase of $I_{SENSE}$, the sense voltage $V_{SENSE}$ 740 will remain close enough to VDD such that the potential difference $V_{SENSE}$–VDD does not reach the threshold voltages of the transistors MP3 and MP4. In this instance, the transistors MP3 and MP4 remain in an OFF state.

In the output stage 320, since the transistor MP4 is in an OFF state, the input voltage VIN 720 on the input node 324 of the inverter 322 will remain at VSS, and the output voltage $V_{OUT}$ 730 on the output node 326 will remain at VDD. As such, the transistor MN6 stays in an ON state, and the transistor MN7 keeps the input voltage VIN 720 on the input node 324 of the inverter 322 at VSS (since MP4 and MP6 remain in an OFF state). At the completion of the read operation 702, the output voltage $V_{OUT}$ 730 of the output stage 320 of the current sense amplifier 300 will be logic "1" (e.g., VDD) which is representative of the logic "1" state (Q=1) of the memory cell 610 (FIG. 6A). Again, following the read operation 702, as the read wordline voltage RWL 710 is deasserted to logic "0", the control signal $\overline{RST}$ 700 transitions to logic "0" and the control signal RST transitions to logic "1", thereby initiating a next reset/standby operating mode of the current sense amplifier 300.

Figure 8:
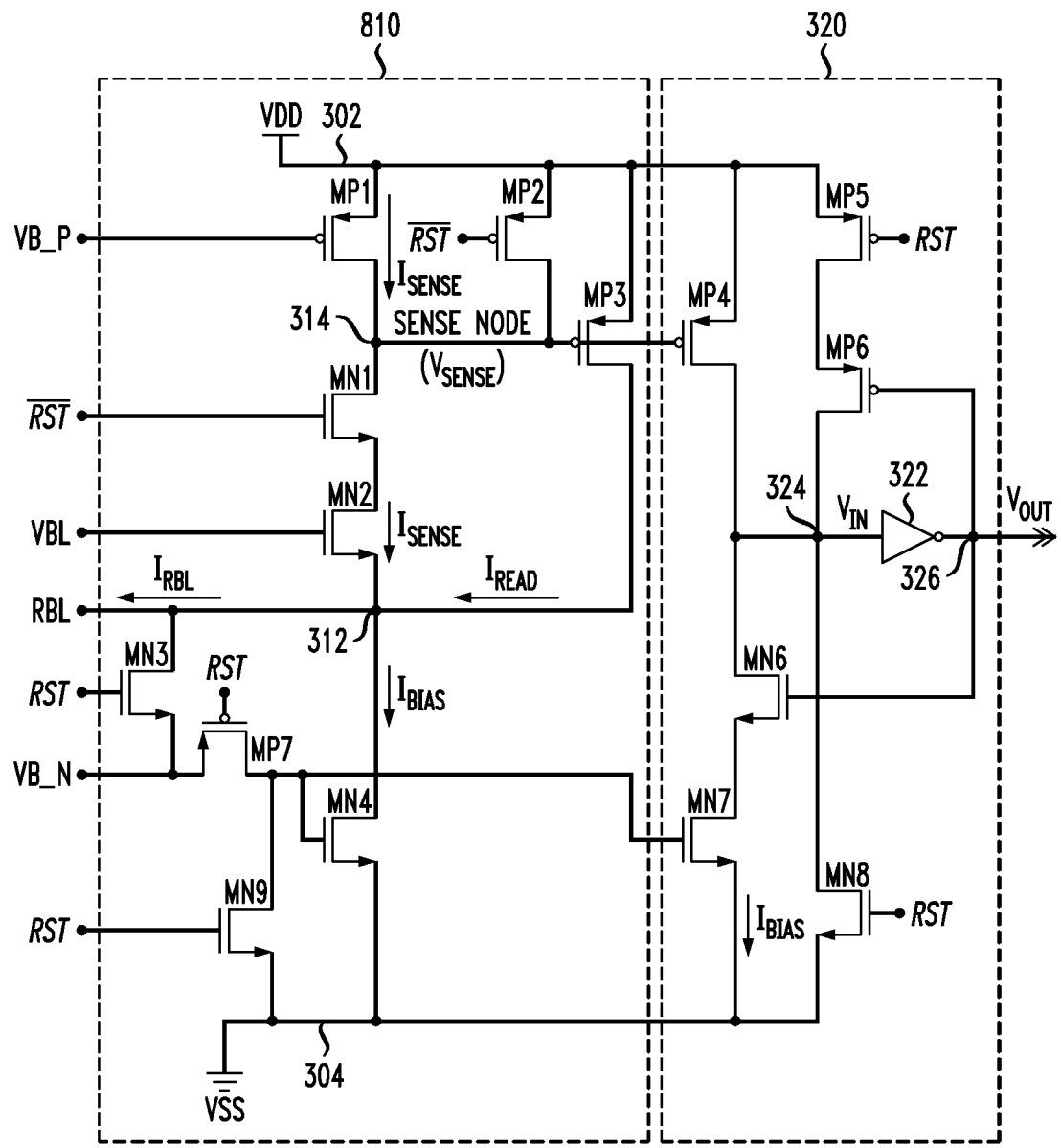
FIG. 8 schematically illustrates a single ended bitline current sense amplifier circuit, according to another exemplary embodiment of the disclosure.

FIG. 8 schematically illustrates a single ended bitline current sense amplifier circuit, according to another exemplary embodiment of the disclosure. In particular, FIG. 8 schematically illustrates a single ended bitline current sense amplifier circuit 800 which is similar the single ended bitline current sense amplifier circuit 300 of FIG. 3, except that the single ended bitline current sense amplifier circuit 800 has an input stage 810 which further comprises a PMOS transistor MP7 and an NMOS transistor MN9, which are configured to control a power down state of the sense amplifier circuit 800 by selectively shutting down the flow of bias current $I_{BIAS}$ in the bias current paths of the input stage 810 and the output stage 320. Furthermore, as shown in FIG. 8, the source terminal of the NMOS transistor MN4 is connected to the VSS rail 304, such that the input stage 810 of the single ended bitline current sense amplifier circuit 800 does not include the NMOS transistor MN5 which is included in the input stage 310 of the sense amplifier 300 of FIG. 3.

As shown in FIG. 8, the PMOS transistor MP7 has a source terminal connected to the VB_N bias voltage input node, a drain terminal connected to the gate terminals of the transistors MN4 and MN7, and a gate terminal connected to the RST control input node. The NMOS transistor MN9 has a source terminal connected to the VSS rail 304, a drain terminal connected to the gate terminals of the transistors MN4 and MN7, and a gate terminal connected to the RST control input node. With this configuration, during a power down/standby state, the control signal RST has a logic "1" level, which drives the PMOS transistor MP7 into an OFF state, and drives the NMOS transistor MN9 into an ON state. In this state, the gate terminals of the transistors MN4 and MN7 are disconnected from the VB_N bias voltage input node, and are connected (pulled down) to the VSS rail 304 through the NMOS transistor MN5, which causes the transistors MN4 and MN7 to be driven to an OFF state. With the transistors MN4 and MN7 turned OFF, no quiescent current $I_{BIAS}$ will flow in the bias current paths of the input stage 810 and the output stage 320. In the exemplary embodiment of FIG. 8 (similar to the exemplary embodiments of FIGS. 3 and 4), the transistor MN3 is ON during the power down/standby mode to couple the bitline RBL to the VB_N bias voltage input node to hold the read bitline RBL to the bias voltage VB_N and prevent the bitline RBL from floating during the power down/standby state.

Figure 9:
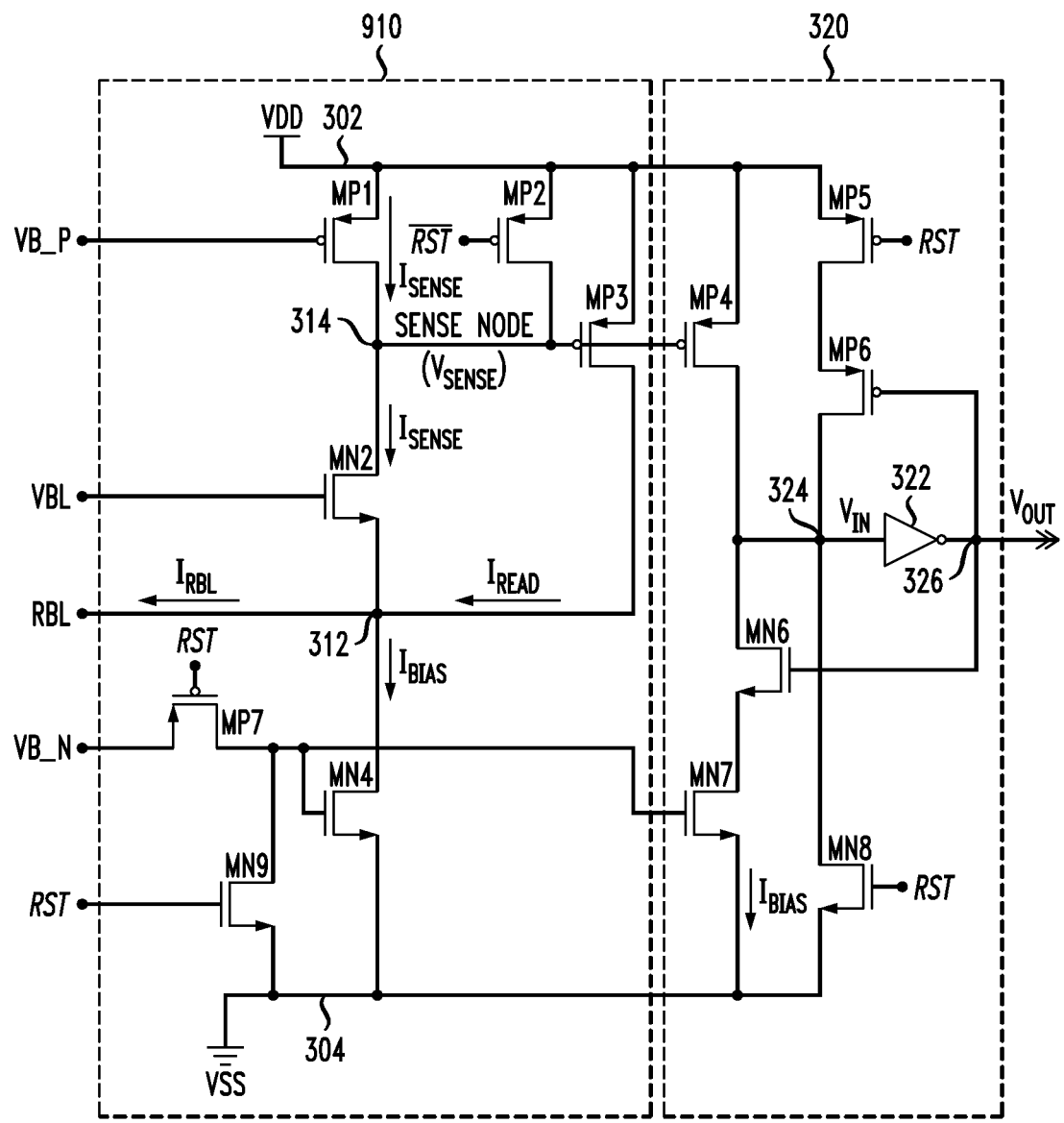
FIG. 9 schematically illustrates a single ended bitline current sense amplifier circuit, according to another exemplary embodiment of the disclosure.

FIG. 9 schematically illustrates a single ended bitline current sense amplifier circuit, according to another exemplary embodiment of the disclosure. In particular, FIG. 9 schematically illustrates a single ended bitline current sense amplifier circuit 900 which is similar the single ended bitline current sense amplifier circuit 800 circuit of FIG. 8, except that the single ended bitline current sense amplifier circuit 900 has an input stage 910 which does not implement the NMOS transistor MN3, and wherein the feedback circuit does not include the cascode transistor MN1. In the exemplary embodiment of FIG. 9, the transistor MP7 and an NMOS transistor MN9 are configured to control the power down state of the sense amplifier circuit 900 by selectively shutting down the flow of bias current $I_{BIAS}$ in the bias current paths of the input stage 910 and the output stage 320, such as described above. In this state, the bitline node RBL will remain at a precharged bias level (e.g., VDD/2) during the power down/standby mode by operation of the feedback circuit.

The current sense amplifiers shown in FIGS. 3, 4, 8 and 9 can be implemented using multi read port designs (≥2) with 8T SRAM cells, if additional read port transistors are added, and dual read port designs using 6T SRAM cells. In particular, a dual read port design may be implemented with standard 6T SRAM cells. Typically, both bitlines of a 6T SRAM cells have to be evaluated with a differential voltage sense amplifier. With a current sense read amplifier according the present disclosure it may be possible to read the content of the 6T SRAM cell by evaluating only one bitline. Accordingly, a dual read port design may be possible, wherein each bitline may be provided with an independent current read sense amplifier. The 6T SRAM cell may be provided with two independent read wordlines, one for each current read sense amplifier. In particular, the dual read port design may allow for maintaining the operating frequency of the SRAM core. The operating frequency may be above 1 GHz, in particular above 3 GHz. For example, the SRAM core may be operated at 4 GHz.

It is to be understood that exemplary embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a RAM, a read-only memory (ROM), an erasable programmable read-only memory (EPROM or Flash memory), an SRAM, a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to exemplary illustrations of block diagrams, timing diagrams, etc., of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 10:
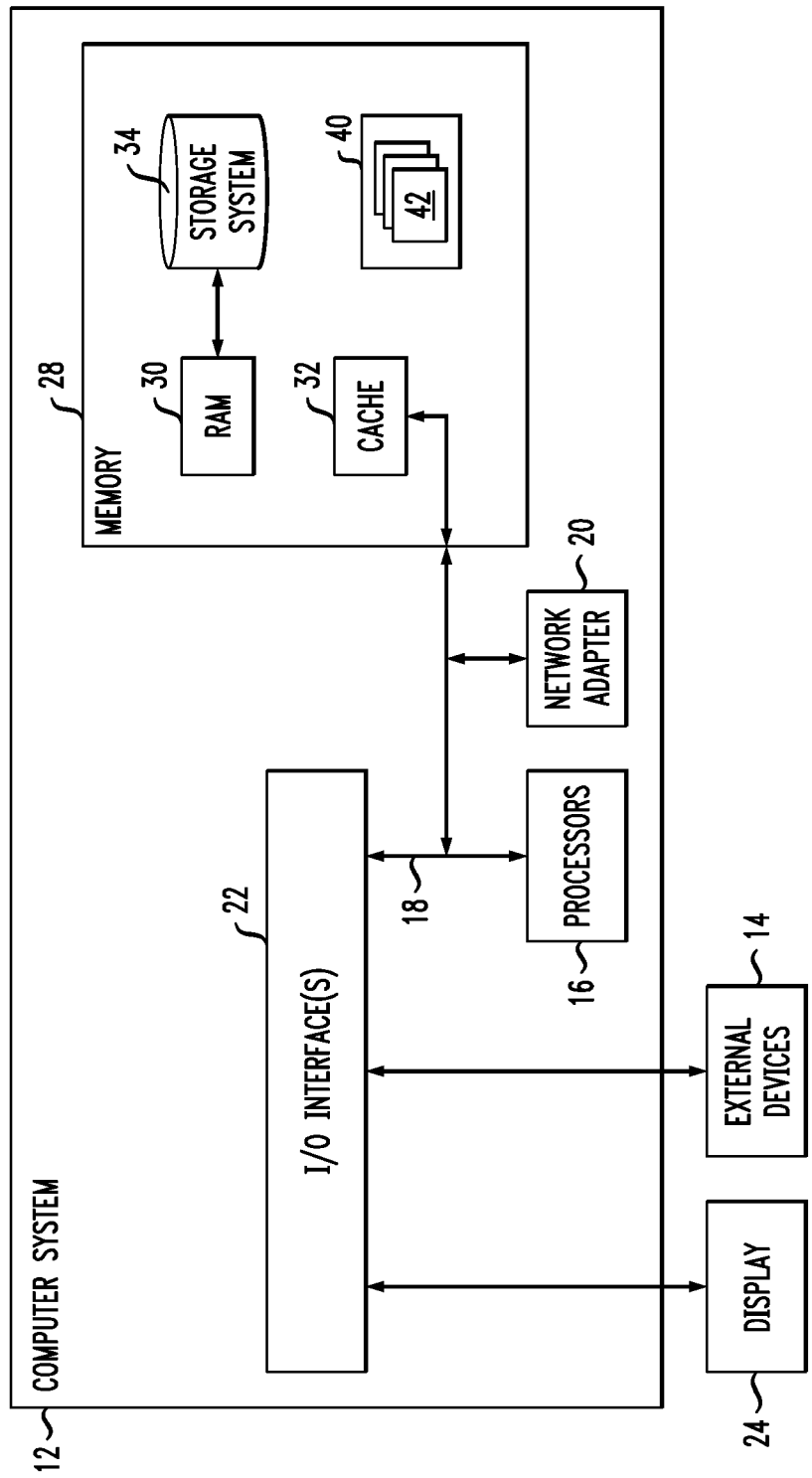
FIG. 10 schematically illustrates an exemplary architecture of a computing node which comprises one or more processor devices and memory devices which implement single ended current sense amplifier circuitry, according to exemplary embodiments of the disclosure.

These concepts are illustrated with reference to FIG. 10, wherein FIG. 10 schematically illustrates an exemplary architecture of a computing node which comprises one or more processor devices and memory devices which implement single ended current sense amplifier circuitry, according to exemplary embodiments of the disclosure. In particular, FIG. 10 illustrates a computing node 10 which comprises a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

In FIG. 10, computer system/server 12 in computing node 10 is shown in the form of a general-purpose computing device. The components of computer system/server 12 may include, but are not limited to, one or more processors 16 or processing units, a system memory 28, and a bus 18 that couples various system components including system memory 28 to the processors 16.

The bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 12 typically includes a variety of computer system readable media. Such media may be any available media that is accessible by computer system/server 12, and it includes both volatile and non-volatile media, removable and non-removable media.

The system memory 28 can include computer system readable media in the form of volatile memory, such as RAM 30 and/or cache memory 32, wherein the RAM 30 and/or cache memory 32 can implement memory devices which implement sense amplifier circuitry such as depicted in the exemplary embodiments of, e.g., FIGS. 3, 4, 8, and 9. The computer system/server 12 may further include other removable/non-removable, volatile/nonvolatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As depicted and described herein, memory 28 may include at least one program product having a set (e.g., at least one) of program modules that are configured to carry out the functions of embodiments of the invention.

The program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the disclosure as described herein for performing read and write operations of a memory device and configuring constituent components of a memory device.

Computer system/server 12 may also communicate with one or more external devices 14 such as a keyboard, a pointing device, a display 24, etc., one or more devices that enable a user to interact with computer system/server 12, and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, SSD drives, and data archival storage systems, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A sense amplifier circuit, comprising:
   a bitline node;
   a sense node; and
   a feedback circuit connected to the bitline node and to the sense node, wherein the feedback circuit comprises a cascode-connected pair of transistors configured to isolate the bitline node from an occurrence of a voltage variation on the sense node.

2. The sense amplifier circuit of claim 1, wherein the cascode-connected pair of transistors comprises:
   a first transistor and a second transistor serially connected between the bitline node and the sense node, wherein the first and second transistors comprise a current sensing path of the feedback circuit;
   wherein the first transistor is configured to control a power down state of the sense amplifier circuit by selectively shutting down current flow in the current sensing path of the feedback circuit.

3. The sense amplifier circuit of claim 2, wherein:
   the first transistor comprises a drain terminal connected to the sense node, a source terminal connected to a drain terminal of the second transistor, and a gate terminal coupled to a first control input node to receive a first control signal to control the power down state of the sense amplifier; and
   the second transistor comprises a source terminal connected to the bitline node, and a gate terminal connected to a first bias voltage input node.

4. The sense amplifier circuit of claim 2, wherein:
   the first transistor comprises a drain terminal connected to a source terminal of the second transistor, a source terminal connected to the bitline node, and a gate terminal coupled to a first control input node to receive a first control signal to control the power down state of the sense amplifier; and
   the second transistor comprises a drain terminal connected to the sense node, and a gate terminal connected to a first bias voltage input node.

5. The sense amplifier circuit of claim 1, further comprising:
   a third transistor serially connected in a bias current path between the bitline node and a power supply node;

wherein the third transistor is configured to control a power down state of the sense amplifier circuit by selectively shutting down current flow in the bias current path.

6. The sense amplifier circuit of claim 5, further comprising:
a fourth transistor comprising a drain terminal connected to the bitline node, and a source terminal connected to bias voltage input node to receive a first bias voltage;
wherein the fourth transistor is configured to selectively connect the bitline node to the bias voltage input node when the sense amplifier is in the power down state.

7. A sense amplifier circuit, comprising:
a bitline node;
a sense node; and
a feedback circuit connected to the bitline node and to the sense node and comprising a current sensing path between the bitline node and the sense node;
wherein the feedback circuit comprises a first transistor serially connected in the current sensing path and configured to control a power down state of the sense amplifier circuit by selectively shutting down current flow in the current sensing path of the feedback circuit.

8. The sense amplifier circuit of claim 7, further comprising:
a second transistor serially connected in a bias current path between the bitline node and a power supply node;
wherein the second transistor is configured to further control the power down state of the sense amplifier circuit by selectively shutting down current flow in the bias current path.

9. The sense amplifier circuit of claim 8, further comprising:
a third transistor comprising a drain terminal connected to the bitline node, and a source terminal connected to bias voltage input node;
wherein the third transistor is configured to selectively connect the bitline node to the bias voltage input node when the sense amplifier is in the power down state.

10. A sense amplifier circuit, comprising:
an input stage and an output stage, wherein the input stage comprises:
a bitline node connected to a bitline;
a sense node connected to the output stage; and
a feedback circuit connected to the bitline node and to the sense node, wherein the feedback circuit comprises:
a first transistor and a second transistor serially connected between the bitline node and the sense node, wherein the first and second transistors comprise a current sensing path of the feedback circuit; and
a third transistor comprising a gate terminal connected to the sense node and a drain terminal connected to the bitline node;
wherein the first transistor is configured to control a power down state of the sense amplifier circuit by selectively shutting down current flow in the current sensing path of the feedback circuit.

11. The sense amplifier circuit of claim 10, wherein:
the first transistor comprises a drain terminal connected to the sense node, a source terminal connected to a drain terminal of the second transistor, and a gate terminal coupled to a first control input node to receive a first control signal to control the power down state of the sense amplifier; and
the second transistor comprises a source terminal connected to the bitline node, and a gate terminal connected to a first bias voltage input node.

12. The sense amplifier circuit of claim 10, wherein:
the first transistor comprises a drain terminal connected to a source terminal of the second transistor, a source terminal connected to the bitline node, and a gate terminal coupled to a first control input node to receive a first control signal to control the power down state of the sense amplifier; and
the second transistor comprises a drain terminal connected to the sense node, and a gate terminal connected to a first bias voltage input node.

13. The sense amplifier circuit of claim 10, further comprising:
a fourth transistor serially connected in a bias current path between the bitline node and a power supply node;
wherein the fourth transistor is configured to further control the power down state of the sense amplifier circuit by selectively shutting down current flow in the bias current path.

14. The sense amplifier circuit of claim 13, further comprising:
a fifth transistor comprising a drain terminal connected to the bitline node, and a source terminal connected to a second bias voltage input node;
wherein the fifth transistor is configured to selectively connect the bitline node to the second bias voltage input node when the sense amplifier is in the power down state.

15. The sense amplifier circuit of claim 10, further comprising:
a sixth transistor comprising a source terminal connected to a power supply rail, a drain terminal connected to the sense node, and a gate terminal connected to a third bias voltage input node, wherein the sixth transistor is configured to supply current to the current sensing path of the feedback circuit; and
a seventh transistor comprising a source terminal connected to the power supply rail, a drain terminal connected to the sense node, and a gate terminal connected to control signal input node, wherein the seventh transistor is configured to selectively connect the sense node to the power supply rail when the sense amplifier is in the power down state.

16. The sense amplifier circuit of claim 10, wherein the output stage comprises:
a preamplifier circuit connected the sense node of the input stage; and
an output latch circuit comprising an input node connected to an output of the preamplifier circuit, and an output node which comprises an output node of the sense amplifier circuit.

17. A memory device, comprising:
an array of memory cells;
first control lines extending in a first direction across the array of memory cells and second control lines extending in a second direction across the array of memory cells, wherein the second control lines comprise a plurality of bitlines;
control circuitry coupled to the first control lines and to the second control lines, wherein the control circuitry comprises singled ended bitline current sense amplifier circuitry coupled to the plurality of bitlines, wherein the singled ended bitline current sense amplifier circuitry comprises at least one sense amplifier circuit connected to a given bitline, wherein the at least one sense amplifier circuit comprises:
a bitline node connected to the given bitline;
a sense node; and a feedback circuit connected to the bitline node and to the sense node, wherein the feedback circuit comprises a cascode-connected pair of transistors configured to isolate the bitline node from an occurrence of a voltage variation on the sense node.

18. The memory device of claim 17, wherein the cascode-connected pair of transistors comprises:
a first transistor and a second transistor serially connected between the bitline node and the sense node, wherein the first and second transistors comprise a current sensing path of the feedback circuit;
wherein the first transistor is configured to control a power down state of the sense amplifier circuit by selectively shutting down current flow in the current sensing path of the feedback circuit.

19. The memory device of claim 18, wherein the at least one sense amplifier circuit further comprises:
a third transistor serially connected in a bias current path between the bitline node and a power supply node;
wherein the third transistor is configured to further control the power down state of the sense amplifier circuit by selectively shutting down current flow in the bias current path.

20. The memory device of claim 19, wherein the at least one sense amplifier circuit further comprises:
a fourth transistor comprising a drain terminal connected to the bitline node, and a source terminal connected to bias voltage input node to receive a first bias voltage;
wherein the fourth transistor is configured to selectively connect the bitline node to the bias voltage input node when the sense amplifier is in the power down state.

21. The memory device of claim 17, wherein the array of memory cells comprises an array of volatile random access memory cells.

22. A processor device comprising the memory device of claim 17.

23. A method, comprising:
generating a current which flows in a current sensing path of a feedback circuit of a sense amplifier circuit, wherein the current sense path comprises first and second transistors which are cascode-connected between a bitline node and sense node of the sense amplifier circuit;
generating, by the feedback circuit, a sense voltage on the sense node which is proportional to the current which flows in the current sense path; and
applying a first control signal to a gate terminal of the first transistor of the feedback circuit to control a power down state of the sense amplifier circuit by deactivating the first transistor to shut down current flow in the current sensing path of the feedback circuit.

24. The method of claim 23, further comprising applying the first control signal to a gate terminal of a third transistor, which is serially connected in a bias current path between the bitline node and a power supply node, to further control the power down state of the sense amplifier circuit by deactivating the third transistor to shut down a flow of bias current in the bias current path of the sense amplifier circuit.

25. The method of claim 24, further comprising:
applying a second control signal to a gate terminal of a fourth transistor of the sense amplifier circuit to activate the fourth transistor and selectively connect the bitline node to a bias voltage input node of the sense amplifier circuit, when the sense amplifier is in the power down state.

* * * * *